United States Patent
Yukawa

(10) Patent No.: US 7,643,076 B2
(45) Date of Patent: Jan. 5, 2010

(54) IMAGE SCANNING DEVICE HAVING MULTIPLE CMOS ELEMENT IN MATRIX FORM

(75) Inventor: Yohei Yukawa, Seto (JP)

(73) Assignee: Denso Corporation, Kariya (JP)

( * ) Notice: Subject to any disclaimer, the term of this patent is extended or adjusted under 35 U.S.C. 154(b) by 695 days.

(21) Appl. No.: 11/392,935

(22) Filed: Mar. 30, 2006

(65) Prior Publication Data

US 2006/0221414 A1 Oct. 5, 2006

(30) Foreign Application Priority Data

Mar. 30, 2005 (JP) .............................. 2005-098078

(51) Int. Cl.
H04N 5/335 (2006.01)
(52) U.S. Cl. ..................................... 348/308
(58) Field of Classification Search .................. 348/308
See application file for complete search history.

(56) References Cited

U.S. PATENT DOCUMENTS

| 5,396,091 | A | 3/1995 | Kobayashi et al. | |
|---|---|---|---|---|
| 5,955,753 | A | 9/1999 | Takahashi | |
| 6,535,576 | B2 * | 3/2003 | Vafi et al. | 378/98.8 |
| 6,952,228 | B2 * | 10/2005 | Yoneda et al. | 348/308 |
| 7,071,980 | B2 * | 7/2006 | Yuki et al. | 348/308 |
| 7,088,394 | B2 * | 8/2006 | Rossi et al. | 348/294 |
| 2004/0160522 | A1 * | 8/2004 | Fossum et al. | 348/308 |
| 2005/0128328 | A1 * | 6/2005 | Kakumoto et al. | 348/308 |

FOREIGN PATENT DOCUMENTS

| EP | 0926-885 | 10/2003 |
|---|---|---|
| JP | A-4-40179 | 2/1992 |
| JP | A-5-118913 | 5/1993 |
| JP | A-2001-45383 | 2/2001 |
| JP | A-2001-145014 | 5/2001 |

OTHER PUBLICATIONS

Office Action dated Jun. 29, 2009 from the Canadian Patent Office in the corresponding CA Application No. 2,541,466.

* cited by examiner

*Primary Examiner*—Tuan Ho
*Assistant Examiner*—Kent Wang
(74) *Attorney, Agent, or Firm*—Posz Law Group, PLC

(57) ABSTRACT

An image scanning device divides an image scanning element group into a plurality of areas and an image signal is output for every area. The device includes a plurality of charge integrating units respective provided in each of the plurality of areas for integrating charges output from plural image scanning elements and outputting the charges thus integrated as an integrated charge, an integrated charge selecting unit for selecting any one or more integrated charges from the plural integrated charges and outputting the integrated charges thus selected, a charge accumulating unit for accumulating and combining any one or more integrated charges output from the integrated charge selecting unit; and an image signal outputting unit for converting the composite charge accumulated in the charge accumulating unit to an image signal and outputting the image signal.

4 Claims, 11 Drawing Sheets

IMAGE SCANNING DEVICE HAVING MULTIPLE CMOS ELEMENT IN MATRIX FORM

CROSS REFERENCE TO RELATED APPLICATION

This application is based on and incorporates herein by reference Japanese patent application No. 2005-98078 filed on Mar. 30, 2005.

TECHNICAL FIELD

The technical field relates to an image scanning device equipped with an image scanning element group constructed by arranging CMOS type image scanning elements in a matrix form.

BACKGROUND

"IMAGE SCANNING DEVICE AND SELECTING CIRCUIT" disclosed in JP-A-2001-45383 (pages 2 to 5, FIGS. 1 to 11)(hereinafter referred to as Patent Document 1) has been known as an image scanning device having an image scanning element group constructed by arranging image scanning elements in a matrix form. This type of image scanning device is designed so that pixel portions (image scanning elements) arranged in a matrix form to constitute an image scanning element group are sequentially scanned by a horizontal shift register portion for selecting the image scanning elements for every column and a vertical shift register portion for selecting the image scanning elements every line to thereby take out a pixel signal from each pixel portion. In order to solve problems such as an increase of the scale of the peripheral circuits and increase of the scanning time in connection with increase of the number of the image scanning elements, that is, the number of pixels, there has been proposed an image scanning device having the construction that the sensor portion is divided into plural selection blocks and the scanning is carried out every selection block.

Furthermore, there is also known an image scanning device using a CMOS type as an image scanning device (CMOS image sensor), and for example, there is known "SOLID-STATE IMAGE SCANNING DEVICE" disclosed in JP-A-11-196332 (pages 2 to 6, FIGS. 1 to 9)(hereinafter referred to as Patent Document 2).

However, this image scanning device has problems in pixel signal take-in speed, current consumption, etc., and thus a mechanism of reading a necessary range of pixel signals on a block basis to solve the above problem has been proposed.

According to the techniques disclosed in the above documents, plural image scanning elements are blocked every predetermined range, and scanning or skip reading is carried out for every block, thereby achieving high-speed reading in spite of reduction in resolution.

However, according to the "IMAGE SCANNING DEVICE AND SELECTING CIRCUIT" disclosed in the Patent Document 1, the pixel portions can be scanned on a selection block basis (patent Document 1; FIGS. 2, 3), however, the pixel signals in each selection block are successively read out and outputted to the external (Patent Document 1; FIG. 4). Therefore, in order to process these pixel signals, it is necessary that after the pixel signals are subjected to A/D conversion, they are temporarily stored in a memory device or the like and then the output values of any pixels are summed and processed. Therefore, not only the signal processing is cumbersome, but also the memory device as described above and the peripheral circuits thereof are indispensable. In the Patent Document 1, a DRAM memory is used as a temporary storage area to execute image processing, and data stored in this memory are processed by MPU or camera DSP. Accordingly, there is a problem that it is difficult to simplify the output processing of the device concerned, and enhancement of the processing is disturbed. Furthermore, the memory device or the like is required to be provided at the outside of the image scanning device concerned, so that the scale of the system is increased as a whole and also the cost of products is increased.

Furthermore, no specific construction is disclosed in the "SOLID-STATE IMAGE SCANNING DEVICE" disclosed in the Patent Document 2. However, as in the case of the Patent Document 1, after A/D conversion is carried out, it is necessary to store pixel data into a memory device or the like before digital signal processing. Therefore, it is estimated that a memory device as described above and peripheral circuits therefore are indispensable to this technique, and thus this technique has also the same problems as described above. Furthermore, even when such a memory device and a CMOS type image scanning device can be formed on the same semiconductor substrate by a CMOS manufacturing process, the mount area of the memory device, etc. is required on the semiconductor substrate, and thus the chip size may be increased in connection with increase of the storage capacity, and also the manufacturing cost may be further increased in accordance with the scale of the memory device and the peripheral circuits therefore.

On the other hand, in a case where the image scanning device is designed so that all pixel signals output from the respective image scanning elements after A/D conversion are subjected to signal processing by MPU or DSP without using any memory device, all the pixel signals of the respective image scanning elements are read out, and then a necessary range of pixel signals are read out every block on the basis of the signal processing result and subjected to signal processing again. Therefore, twice or more reading operation is forcedly required to the memory device, so that the processing speed of MPU or the like is lowered. Furthermore, when the high-speed operation is required, the reading frequency to the image scanning elements is increased, which causes increase of the processing time and thus it is difficult to satisfy the requirement concerned. On the other hand, the above-described problems can be solved by utilizing as a memory device, MPU or the like a semiconductor device that can shorten the memory access time. However, it induces such a new problem that power consumption and heating value are increased due to the high speed operation.

SUMMARY

In view of the foregoing problems, it is an object to provide an image scanning device that can simplify signal processing at the external.

It is another object to provide an image scanning device that can enhance the signal processing speed at the external.

It is another other object to provide an image scanning device that can miniaturize the device concerned and the whole system containing the device concerned.

In order to attain the above objects, according to a first aspect, an image scanning device in which an image scanning element group constructed by arranging CMOS type image scanning elements in a matrix form is divided into plural areas and an image signal is output every area, comprises: plural charge integrating units each of which is provided for every area, integrates charges output from plural image scanning elements arranged in the area concerned and outputs the charges thus integrated as an integrated charge; an integrated charge selecting unit for selecting any one or more integrated charges from the plural integrated charges output from the plural charge integrating units and outputting the integrated charges thus selected; a charge accumulating unit for accumulating and combining any one or more integrated charges output from the integrated charge selecting unit as a composite charge; and an image signal outputting unit for converting the composite charge accumulated in the charge accumulating unit to an image signal and outputting the image signal thus converted.

According to a second aspect, in the image scanning device of the first aspect, the integrated charge selecting unit repetitively selects the plural integrated charges output from the plural charge integrating units in a predetermined order and outputting the integrated charges to the charge accumulating unit.

According to a third aspect, the image scanning device of the first or second aspect is further equipped with an area selecting unit for selecting one or more arbitrary areas out of the plural areas, and an in-area pixel charge output control unit for controlling plural image scanning elements arranged in the one or more areas selected by the area selecting unit so that charges can be output in a predetermined order from the plural image scanning elements.

According to a fourth aspect, the image scanning device of the third aspect is further equipped with a pixel charge output control unit for controlling the plural image scanning elements so that charges can be output in a predetermined order irrespective of the plural areas, wherein the in-area pixel charge output control unit constitutes a part or the whole of the pixel charge output control unit.

According to a fifth aspect, in the image scanning device of any one of the first to fourth aspects, at least one of the charge integrating unit, the integrated charge selecting unit, the charge accumulating unit and the image signal output unit is formed in a semiconductor substrate in which the image scanning element group is formed.

In order to attain the object, according to a sixth aspect, an image scanning device in which an image scanning element group constructed by arranging CMOS type image scanning elements in a matrix form is divided into plural areas and an image signal is output every area, comprises: plural charge accumulating units each of which is provided to each of the plural areas or commonly provided to two or more of the plural areas and can accumulate and combine charges output from plural image scanning elements arranged in the area concerned as a composite charge; plural image signal output units each of which is provided for every charge accumulating unit, converts the composite charge accumulated in the charge accumulating unit to an image signal and then outputs the image signal thus converted; and an output signal selecting unit for selecting any image signal from plural image signals output from the plural image signal output units and outputting the image signal thus selected.

According to a seventh aspect, in the image scanning device of the sixth aspect, the output signal selecting unit repetitively selects and outputs plural image signals output from the plural image signal output units in a predetermined order.

According to an eighth aspect, the image scanning device of the sixth or seventh aspect is further equipped with an area selecting unit for selecting one or more arbitrary areas out of the plural areas, and an in-area pixel charge output control unit for controlling the plural image scanning elements so that charges are output in a predetermined order from plural image scanning elements arranged in the one or more areas selected by the area selecting unit.

According to a ninth aspect, the image scanning device of the eighth aspect is equipped with a pixel charge output control unit for controlling the plural image scanning elements so that the charges can be output in a predetermined order irrespective of the plural areas, and the in-area pixel charge output control unit constitutes a part or the whole of the pixel charge output control unit.

According to a tenth aspect, in the image scanning device according to any one of the sixth to ninth aspects, at least one of the charge accumulating unit, the image signal output unit and the output signal selecting unit is formed in a semiconductor substrate in which the image scanning element group is formed.

According to the first aspect, the charges output from plural image scanning elements arranged in each of the plural areas are collected and output as an integrated charge by each of the charge integrating units, and any one or more integrated charges is selected from the plural integrated charges thus output by the integrated charge selecting unit. Any one or more integrated charges output from the integrated charge selecting unit are accumulated and combined by a charge accumulating unit, and further the composite charge accumulated in the charge accumulating unit is converted to an image signal by the image signal output unit and then the image signal is output.

Accordingly, an image having low resolution can be easily achieved without separately providing any circuit and any processing of combining pixel signals (charge) because any of the charges integrated for every area, that is, the integrated charges of the respective areas can be output as an image signal and also any plural integrated charges can be combined and output as an image signal. Accordingly, the signal processing circuit, etc. at the outside can be simply constructed. Furthermore, it is unnecessary to provide the processing of combining the pixel signals (charges) at the outside, and thus the signal processing speed at the outside can be enhanced. Furthermore, neither a memory device required to combine the pixel signals (charge) nor peripheral circuits thereof which have been hitherto required to combine pixel signals (charges) are required, and thus the whole system containing the device concerned can be miniaturized. This also contributes to reduction in cost required to construct the system.

According to the second aspect, the integrated charge selecting unit repetitively selects the plural integrated charges output from the plural charge integrating units in a predetermined order, and outputs the thus-selected integrated charges to the charge accumulating unit. Accordingly, in any areas outputting the plural integrated charges, an image signal can be repetitively achieved although the resolution is low. Therefore, when a target object is chased in a specific range and an image signal is achieved, it is unnecessary to provide a circuit therefore and also control processing thereof, and a desired image signal can be achieved easily and quickly. Accordingly, the signal processing at the outside can be simplified, and the processing speed can be enhanced. Furthermore, the whole system containing the device concerned can be miniaturized.

According to the third aspect, one or more arbitrary areas are selected from the plural areas by the area selecting unit, and the plural image scanning elements are controlled by the in-area pixel charge output control unit so that the charges can be output in a predetermined order from the plural image scanning elements arranged in the one or more areas selected by the area selecting unit. Accordingly, the charges are output in the predetermined order from the plural image scanning elements arranged in the arbitrary area(s) of the plural areas, and thus an image signal having high resolution in the arbitrary area(s) concerned can be achieved. Therefore, for example, when a target object is recognized by an image signal having low resolution based on the integrated charge of each area, the existence range of the target object concerned is set to the arbitrary area concerned, whereby the target object can be recognized by an image signal having high resolution. That is, it is unnecessary to separately provide a circuit or processing of achieving an image signal having high resolution, and both an image signal having low resolution and an image signal having high resolution can be output. Accordingly, the signal processing at the outside can be more simplified, and the processing speed can be further enhanced. Furthermore, the whole system containing the device concerned can be miniaturized.

According to the fourth aspect, the image scanning device of the third aspect that is equipped with the pixel charge output control unit for controlling the plural image scanning elements so that charges can be output in a predetermined order irrespective of the plural areas, and the in-area pixel charge output control unit constitutes a part or the whole of the pixel charge output control unit. Accordingly, the in-area pixel charge output control unit can be constructed by using some or all of the circuit elements constituting the pixel charge output control unit, and thus the circuit scale can be reduced as compared with the case where these elements are not used. Accordingly, the whole system containing the device concerned can be further miniaturized.

According to the fifth aspect, at least one of the charge integrating unit, the integrated charge selecting unit, the charge accumulating unit and the image signal output unit is formed in the semiconductor substrate in which the image scanning element group is formed. Accordingly, these elements can be formed in the same semiconductor chip as the image scanning element group. Accordingly, the device concerned can be miniaturized as compared with the case where the charge integrating unit, the integrated charge selecting unit, the charge accumulating unit and the image signal output unit are provided separately from the semiconductor substrate in which the image scanning element group is formed.

According to the sixth aspect, the charges output from the plural image scanning elements arranged in the plural areas are accumulated and combined as a composite charge by the plural charge accumulating units, and the composite charge is converted to the image signal and output by the plural image signal output units. Then, any image signal is selected from the plural image signals output from the plural image signal output units and then output by the output signal selecting unit.

Accordingly, any composite charge combined every area or any composite charge combined commonly to two or more areas can be converted to the image signal, and any image signal thus converted can be selected and output, so that an image having low resolution can be easily achieved without separately providing the circuit and the processing of combining the pixel signals (charges). Accordingly, the signal processing circuit, etc. at the outside can be simply constructed. Furthermore, it is unnecessary to provide the processing of combining pixel signals (charges) at the outside, and thus the signal processing speed at the outside can be enhanced. Still furthermore, a memory device and peripheral circuits thereof which have been hitherto required to combine pixel signals (charges) are not required, and thus the whole system containing the device concerned can be miniaturized. This contributes to reduction in cost to construct the system. As compared with the first aspect, it is necessary to provide plural charge accumulating units, however, the charge accumulating unit is provided every area, so that each charge accumulating unit can be designed so as to have a smaller accumulation capacity as compared with the first aspect. Accordingly, even when it is difficult to construct a charge accumulating unit having a large capacity, the system can be constructed. Therefore, this aspect is more advantageous than the first aspect.

According to the seventh aspect, the output signal selecting unit repetitively selects the plural image signals output from the plural image signal output units in a predetermined order and outputs the plural image signals thus selected. Accordingly, in the arbitrary areas corresponding to the plural image signals, image signals are repetitively achieved although the resolution is low. Therefore, for example when it is desired to chase a target object with respect to a specific range to achieve an image signal, neither a circuit nor control processing is required at the outside to satisfy the above desire, so that a desired image signal can be easily and quickly. Accordingly, the signal processing at the outside can be simplified, and the processing speed can be enhanced. Furthermore, the whole system containing the device concerned can be miniaturized.

According to the eighth aspect, one or more arbitrary areas out of the plural areas are selected by the area selecting unit, and the plural image elements are controlled by the in-area pixel charge output control unit so that charges can be output in a predetermined order from the plural image pixels arranged in the area selected by the area selecting unit. Accordingly, the charges are output in the predetermined order from the plural image scanning elements arranged in an arbitrary area out of the plural areas, so that an image signal having high resolution can be achieved in the arbitrary area concerned. Therefore, for example when a target object is recognized on the basis of a low-resolution image signal based on a composite character of each area, the target object concerned can be recognized on the basis of a high-resolution image signal by setting the existence range of the target object concerned to the arbitrary area concerned. That is, neither circuit nor processing is separately required at the outside to achieve the high-resolution image signal, and both the low-resolution image signal and the high-resolution image signal can be output. Accordingly, the signal processing at the outside can be further simplified, and the processing speed can be further enhanced. Furthermore, the whole system containing the device concerned can be miniaturized.

According to the ninth aspect, the image scanning device of the eighth aspect is equipped with the pixel charge output control unit for controlling the plural image scanning elements so that charges can be output in a predetermined order irrespective of the plural areas, and the in-area pixel charge output control unit constitutes a part or the whole of the pixel charge output control unit. Accordingly, the in-area pixel charge output control unit can be constructed by using a part or all of the circuit elements constituting the pixel charge output control unit which is normally equipped, so that the circuit scale can be reduced as compared with the case where these elements are not used. Accordingly, the whole system containing the device concerned can be miniaturized.

According to the tenth aspect, at least one of the charge accumulating unit, the image signal output unit and the output signal selecting unit is formed in a semiconductor substrate in which the image scanning element group is formed. Accordingly, these elements can be formed in the same semiconductor chip as the image scanning element group. Accordingly, the device concerned can be miniaturized as compared with the case where the charge accumulating unit, the image signal output unit and the output signal selecting unit are provided separately from the semiconductor substrate in which the image scanning element group is formed.

DETAILED DESCRIPTION OF THE PREFERRED EMBODIMENTS

Preferred embodiments of an image scanning device will be described hereunder with reference to the accompanying drawings.

Figure 4A:
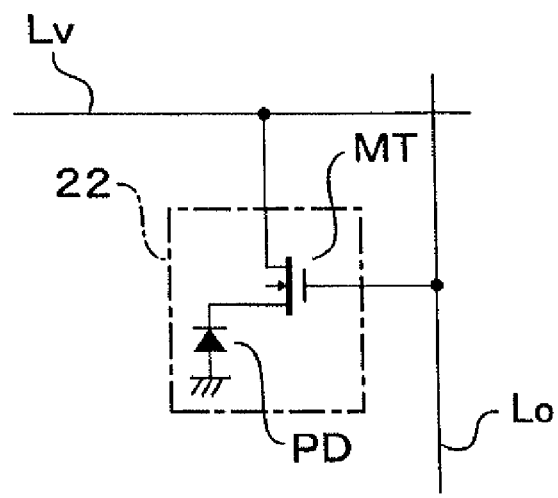
FIG. 4A is a circuit diagram showing a construction of an unit pixel.

First, the basic construction of an imager 20 according to an embodiment will be described with reference to FIGS. 1 and 4A-4B.

Figure 1:
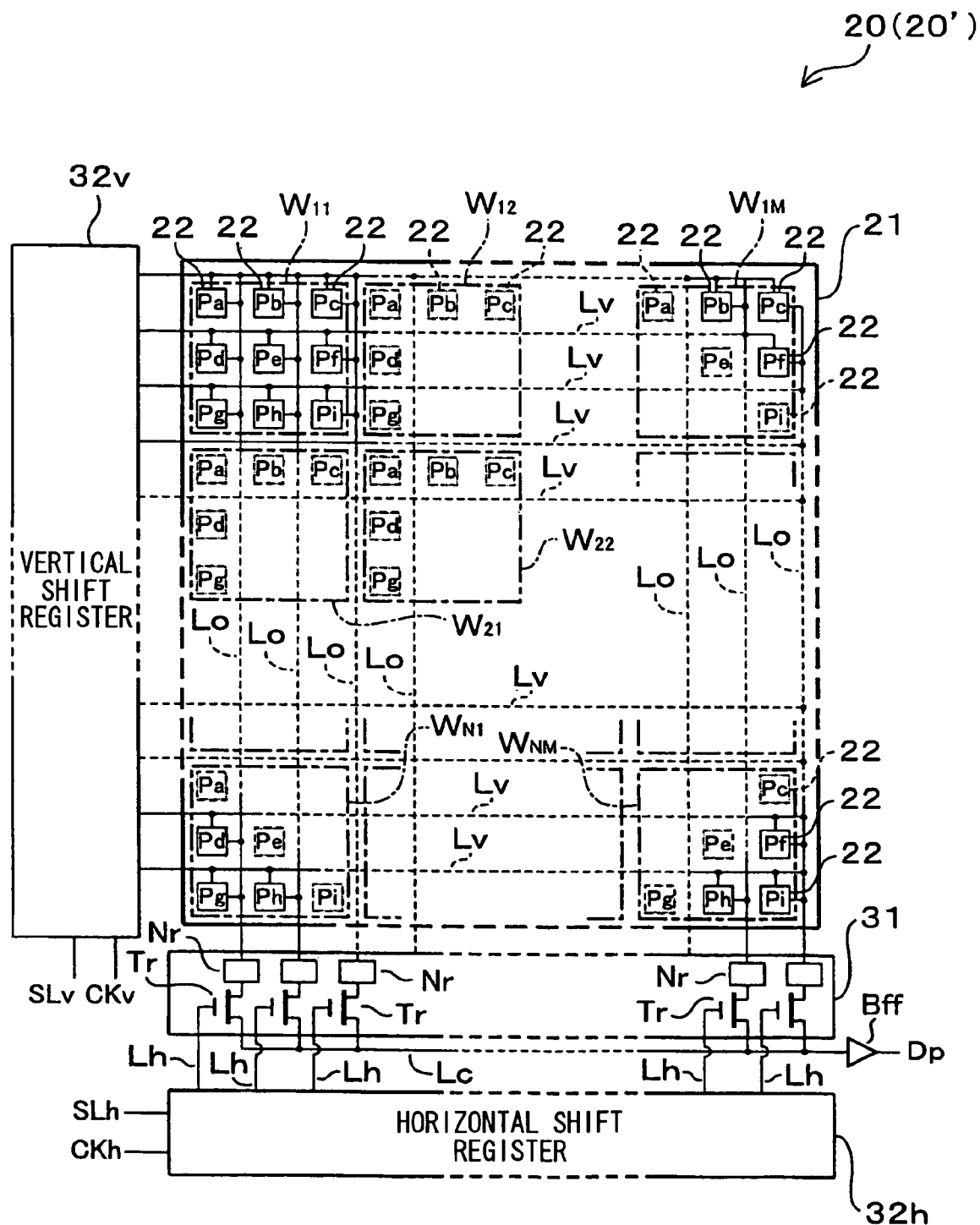
FIG. 1 is a block diagram showing the summary of the basic construction of an imager according to an embodiment.

As shown in FIG. 1, the imager 20 mainly comprises an imager photo array 21, a pixel signal output circuit 31, a horizontal shift register 32h, a vertical shift register 32v, an output buffer Bff, etc.

The imager photo array 21 is equipped with plural imager unit pixels (hereinafter referred to as "unit pixel") 22 arranged in a matrix form. That is, in the image photo array 21, each unit pixel 22 is connected to a control line Lv and an output line Lo at each grid point formed by the control line Lv provided on each line and the output line Lo provided on each column, whereby any unit pixel 22 can be arbitrarily selected by the horizontal shift register 32h and the vertical shift register 32v.

According to the imager 20 of this embodiment, the imager photo array 21 comprising plural unit pixels 22 is designed so as to be divisible into predetermined areas (blocks) (hereinafter referred to as "sub windows"). For example, blocks each of which comprises nine unit pixels 22 are arranged on 3 lines×3 columns to thereby set sub windows W11, W12, ... , W1M, W21, W22, ..., WN1, ..., WNM (subscripts M, N represent positive integers, hereinafter referred to as "sub windows W11 to WNM"), so that the imager 20 can collectively (integrally) select the unit pixels 22 of each sub window for every sub window W11 to WNM as described later. The imager photo array 21 constitutes an "image scanning element group", and the sub windows W11 to WNM constitute "plural areas."

The unit pixel 22 is a semiconductor device formed by the CMOS manufacturing process, and for example it comprises a CMOS type photodiode PD and a MOS transistor MT. That is, as shown in FIG. 4A, the drain terminal of the MOS transistor MT is connected to the cathode terminal of the photodiode PD, and the anode terminal of the photodiode PD is connected to ground. The control line Lv is connected to the gate terminal of the MOS transistor MT, and further the output line Lo is connected to the source terminal of the MOS transistor MT. Accordingly, when a selection signal is applied to the gate terminal of the MOS transistor MT though the control line Lv, the MOS transistor MT can be set to ON-state. Therefore, the charges accumulated in the photodiode PD can be output as a pixel signal to the output line Lo. The unit pixel 22 constitutes an "image scanning element."

A pixel signal output circuit 31 is a circuit for selecting the pixel signal (charges) output from each unit pixel 22 through each output line Lo, and it has plural switching transistors Tr corresponding to the respective output lines Lo. That is, the drain terminal of each MOS transistor Tr is connected to the corresponding output line Lo, the source terminal of each MOS transistor Tr is connected to a common output line Lc, and the gate terminal of each MOS transistor Tr is connected to a control line Lh. In this embodiment, a noise removing circuit Nr based on a dual correlation sampling (CDS) method is interposed between the drain terminal of each MOS transistor Tr and the corresponding output line Lo, and thus noise components contained in the pixel signals (charges) can be effectively removed. Accordingly, when the selection signal is applied to the gate terminal of the MOS transistor Tr through the control line Lh, the MOS transistor Tr can be set to ON-state, and thus the pixel signal (charges) input from the output line Lo can be output to the common output line Lc.

The horizontal shift register 32h is a logic circuit that can output serially-input horizontal selection data SLh to the respective control lines Lh according to the timing of a horizontal clock CKh in parallel, and for example, it is constructed by connecting D flip flops in multistage. That is, the selection signal is successively and selectably output from the horizontal shift register 32h to each control line Lh according to the clock timing. Therefore, each MOS transistor Tr of the pixel signal output circuit 31 can be successively turned on/off for every column by the selection signal concerned. Accordingly, the pixel signals (charges) can be taken out from the unit pixels 22 through the output lines Lo. The horizontal shift register 32h constitutes a "pixel charge output control unit."

As in the case of the horizontal shift register 32h, the vertical shift register 32v is also a logic circuit that can output serially-input data in parallel (constructed by connecting D flip flops in multistage, for example), and it outputs vertical selection data SLv to the respective control lines Lv in parallel according to the timing of the vertical clock CKv. That is, the selection signal is successively and selectably output to each control line Lv from the vertical shift register 32v every line according to the clock timing. Therefore, the MOS transistors MT of the respective unit pixels 22 are successively turned on/off for every line by the selection signal concerned. Accordingly, the charges accumulated in the photodiode PD of each unit pixel 22 can be output as a pixel signal to the output line Lo. The vertical shift register 32v corresponds to a "pixel charge output control unit."

The output buffer Bff is a buffer amplifier for achieving required output current to be supplied to an external circuit, carrying out impedance matching, etc., and it is connected to the common output line Lc of the pixel signal output circuit 31 so that it can output the pixel signal (charges) output from each unit pixel 22 as an imager signal Dp to the outside.

By constructing the above-described basic structure in the imager 20, the selection signal output from the vertical shift register 32v is successively applied to the unit pixels 22 arranged in a matrix form for every line, that is, the scanning in the vertical direction is carried out. Therefore, in the respective unit pixels 22 of each line selected by application of the selection signal concerned, the MOS transistors MT are turned on, and also the charges accumulated in the photodiodes PD are output to the respective output lines Lo through the turn-on MOS transistors MT concerned. On the other hand, the selection signal output from the horizontal shift register 32h is successively applied to the respective MOS transistors Tr of the pixel signal output circuit 31 which correspond to the respective columns of the matrix arrangement, that is, the scanning in the horizontal direction is carried out. Therefore, the respective output lines Lo are successively connected to the common output line Lc through the MOS transistors Tr which are successively selected and turned on by application of the selection signal concerned.

Accordingly, out of the pixel signals (charges) output from the respective unit pixels 22 selected by the vertical shift register 32v, the pixel signal which is output to the output line Lo corresponding to the column selected by the horizontal shift register 32h is input to the output buffer Bff. Therefore, the plural unit pixels 22 arranged in the matrix form are successively scanned in the horizontal direction and in the vertical direction by combining the line selection timing based on the vertical shift register 32v and the column selection timing based on the horizontal shift register 32h, thereby achieving the pixel signal (charges) of each unit pixel. Accordingly, the pixel signal (charges) achieved from each unit pixel 22 can be achieved as an imager signal Dp from the output buffer Bff.

Next, a construction in which the imager 20 having the basic construction described above is designed so that the plural unit pixels 22 arranged in the matrix form can be blocked (grouped) into sub windows W11 to WNM will be described with reference to FIGS. 2 to 4A-4B.

As described above, the imager 20 according to this embodiment is designed so that the plural unit pixels 22 arranged in the matrix form are grouped of nine for each unit (3 lines×3 columns) for example, thereby setting the concept of a sub window including nine unit pixels, and the charges collected (integrated) for every sub window (hereinafter referred to as "integrated charge") are taken out every sub window. The sub window W31 will be representatively described hereunder with reference to FIG. 2, however, the following description can be applied to the other sub windows W11 W12, W13, W21, W22, W23, W32, W33, . . . , WNM.

That is, the nine unit pixels 22 (Pa, Pb, Pc, Pd, Pe, Pf, Pg, Ph, Pi) constituting the sub window W31 are connected to one another so that the outputs thereof are bundled (integrated) by a coupling circuit 23, whereby the pixel signals (charges) output from the unit pixels 22 of the sub window W31 can be collected as an integrated charge, and output to an MOS switch 26a of a horizontal SBW output selecting switch array 26.

Each horizontal SBW output selecting switch array 26 is a semiconductor switch group that can select any one of the respective sub windows (horizontally-arranged sub windows) W11 to WNM arranged in the horizontal direction, and for example it comprises MOS switches (MOS transistors) 26a, 26b, 26c. In the following description, the horizontal SBW output selecting switch array 26 connected to the sub window W31 will be described.

The horizontal SBW output selecting switch array 26 comprises an MOS switch 26a for controlling the output of the sub window W31, an MOS switch 26b for controlling the output of the sub window W32 and an MOS switch 26c for controlling the output of the sub window W33, and it sets the drain terminal of each MOS switch to an input terminal, and sets the source terminal of each MOS switch to a common output terminal. Accordingly, it controls the ON/OFF operation of each switch in accordance with a voltage state input to the gate terminal of each MOS switch (turned on in the case of H level, and turned off in the case of L level), and controls allowance/prohibition of the output of each of the sub windows W31, W32, W33 arranged in the horizontal direction. That is, it can select in the horizontal direction any one of the sub windows W31, W32, W33 from which the integrated charge can be taken out.

Furthermore, the horizontal SBW output selecting switch array 26 having the same construction is provided for every line, and the gate terminals of the respective MOS switches are connected to one another in the vertical direction (for example, the gate terminal of the sub window W11, the gate of the sub window W21 and the gate terminal of the sub window W31), whereby the sub windows W11, W12, W13 and the sub windows W21, W22, W23 can be likewise selected in the horizontal direction.

With respect to the above-described horizontal SBW output selecting switch array 26 provided for every line, each output terminal thereof is input to a vertical SBW output selecting switch array 27. That is, the output terminal of the horizontal SBW output selecting switch array 26 of each line is connected to each input terminal of the vertical SBW output selecting switch array 27 having the same construction as the horizontal SBW output selecting switch array 26. Accordingly, the three sub windows bundled in the horizontal direction by the horizontal SBW output selecting switch array 26 (for example, the sub windows W11, W12, W13, the sub windows W21, W21, W23, the sub windows W31, W32, W33) can be selected in the vertical direction.

The horizontal SBW output selecting switch arrays 26 and the vertical SBW output selecting switch array 27 are constructed as described above, and connected to the respective sub windows W11 to WNM. Accordingly, the sub windows W11 to WNM can be selected by a control signal output from an SBW selecting circuit 35. That is, control signals with which one of the sub windows W11 to WNW from which the integrated charge should be taken out can be selected on the basis of a two-dimensional coordinate system (NW matrix) are input to the horizontal SBW output selecting switch arrays 26 and the vertical SBW output selecting switch array 27, thereby specifying the sub window for allowing the output of the integrated charges.

Figure 2:
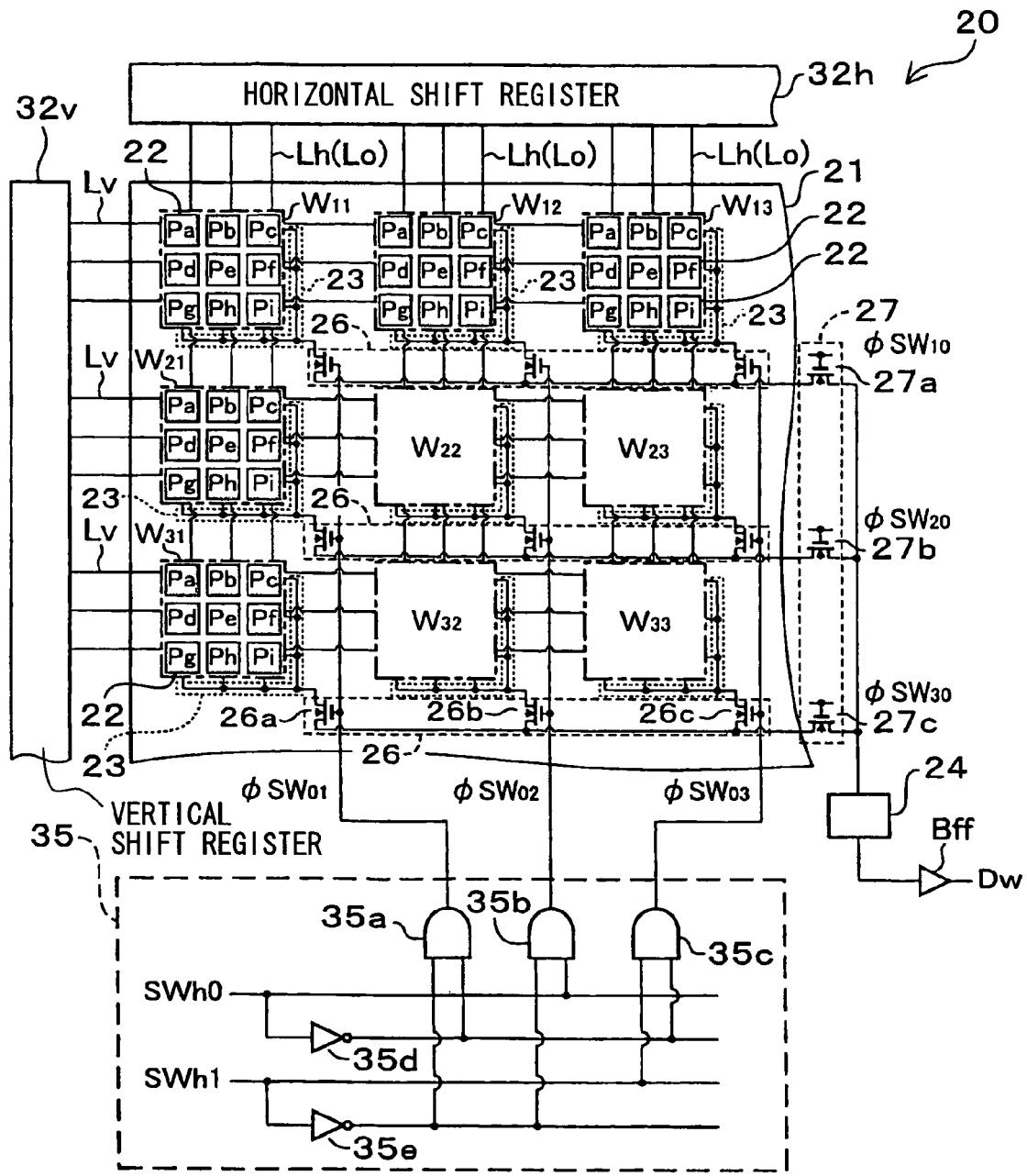
FIG. 2 is a circuit diagram showing a construction of a sub window circuit added to the basic construction shown in FIG. 1.

FIG. 2 shows the construction of the SBW selecting circuit 35 that can output the control signals φSW01, φSW02, φSW03 for the horizontal direction to be input to the horizontal SBW output selecting switch arrays 26. That is, the SBW selecting circuit 35 comprises a decoder circuit that can output the control signals φSW01, φSW02, φSW03 for enabling selection in the horizontal direction of the nine sub windows W11, W12, W13, W21, W22, W23, W31, W32, W33 (hereinafter referred to as "W11 to W33") arranged on 3 lines×3 columns, and it comprises AND circuits 35a, 35b, 35c and inverter circuits 35d, 35e. For example, when "SWh0=0, SWh1=0" is input as a sub window horizontal selecting signal, the control signals φSW01=1, φSW02=0, φSW03=0 are output. When "SWh0=1, SWh1=0" is input, the control signals φSW01=0, φSW02=1, φSW03=0 are output. When "SWh0=0, SWh1=1" is input, the control signals φSW01=0, φSW02=0, φSW03=1. When "SWh0=1, SWh1=1", the control signals φSW01=0, φSW02=0, φSW03=0 are output.

A SBW selecting circuit that can output the control signals φSW10, φSW20, φSW30 of the vertical direction input to the vertical SBW output selecting switch array 27 is not shown, however, it comprises the same decoder circuit as the SBW selecting circuit 35 described above. As in the case of the SBW selecting circuit 35, when "SWv0=0, SWv1=0" is input as a sub window vertical selecting signal, the control signals φSW10=1, φSW20=0, φSW30=1 are output, and when "SWv0=1, SWv1=0" is input, the control signals φSW10=0, φSW20=1, φSW30=0 are output. Furthermore, when "SWv0=0, SWv1=1" is input, the control signals φSW10=0, φSW20=0, φSW30=1 are output, and when "SWv0=1, SWv1=1" is input, the control signals φSW10=0, φSW20=0, φSW30=0 are output.

As described above, the integrated charge output from the sub window W11 to WNM selected by the horizontal SBW output selecting switch arrays 26 and the vertical SBW output selecting switch 27 is input to an SBW image signal output portion 24 connected to the output side of the vertical SBW output selecting switch array 27. Here, the construction of the SBW image signal output portion 24 will be described with reference to FIG. 4B.

Figure 4B:
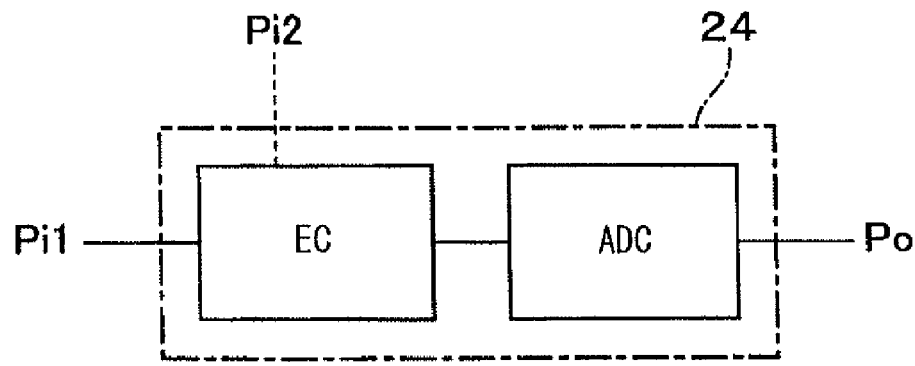
FIG. 4B is a block diagram showing a construction example of an SBW image signal output portion.

As shown in FIG. 4B, the SBW image signal output portion 24 comprises a charge accumulating element EC that can accumulate charges input from input terminals Pi1, Pi2, and an AD converter ADC that can convert the charges accumulated in the charge accumulating element EC to a digital signal and output the digital signal from an output terminal Po. The charge accumulating element EC corresponds to "charge accumulating unit", and the AD converter ADC corresponds to "image signal output unit."

The charge accumulating element EC is a semiconductor capacitor that can be formed by the CMOS process, for example, and is designed so as to accumulate the integrated charge output from the vertical SBW output selecting switch array 27. When the integrated charge output from the vertical SBW output selecting switch array 27 is based on the outputs of the plural sub windows W11 to WNM, the charge accumulating element EC can receive all the integrated charges from the SBW image signal output portion 24 and accumulate and combine any one or more integrated charges as a composite charge. The two input terminals exist in the SBW image signal output portion 24 shown in FIG. 4B because a two-input construction is adopted in an imager 20' (FIG. 3) described later as another embodiment for the sake of convenience.

The AD converter ADC has a function of converting an analog signal to a digital signal, and it can take out the composite charge accumulated in the charge accumulating element EC at a predetermined timing, and convert the composite charge to a digital signal. The digital signal output from the AD converter ADC is an image signal output as a sub window signal Dw, and it represents the composite charge amount as an analog amount by binary expression. This AD converter ADC can be also formed by the CMOS process as in the case of the charge accumulating element EC.

As described above, according to the imager 20 of this embodiment, in addition to the basic construction described above with reference to FIG. 1, the charges output from the plural unit pixels 22 arranged in each sub window W11 to WNM every sub window W11 to WNM are collected and output as an integrated charge by each of the plural coupling circuits 23 which are provided for every sub window W11 to WNM, and any one or more integrated charges are selected from the plural thus-output integrated charges and output by the horizontal SBW output selecting switch arrays 26 and the vertical SBW output selecting switch array 27. Any one or more integrated charges output from the horizontal SBW output selecting switch arrays 26 and the vertical SBW output selecting switch array 27 are accumulated and combined as a composite charge by the charge accumulating element EC, and further the composite charge accumulated in the charge accumulating element EC is converted to a sub window signal Dw by the AD converter ADC, and then output.

Accordingly, any one of the integrated charges which are integrated for every sub window W11 to WNM, that is, any one of the integrated charges of the respective sub windows W11 to WNM can be output as a sub window signal Dw, or any plural integrated charges which are integrated for every sub window W11 to WNM can be combined and output as a sub window signal Dw. Therefore, as compared with a case where the pixel signal (charges) output from each unit pixel 22 is achieved as an imager signal Dp, it is unnecessary that a circuit for combining the imager signals Dp (charges) or the processing thereof is separately provided at the outside, and an image having low resolution can be easily achieved. Accordingly, in the imager 20 according to this embodiment, the signal processing circuit, etc. at the outside can be simply constructed, and also the processing of combining the pixel signals (charges) is not required at the outside. Therefore, the signal processing speed at the outside can be increased. Furthermore, the memory device, the peripheral circuits, etc. which have been hitherto required to combine the pixel signals (charges) are not required in this embodiment, so that the whole system containing the imager 20 concerned can be miniaturized, which contributes to reduction in cost to construct the system.

The whole circuit of the imager 20 can be constructed in the same semiconductor chip by forming the coupling circuits 23, the SBW image signal output portions 24, the horizontal SBW output selecting switch arrays 26, the vertical SBW output selecting switch arrays 27, the pixel signal output circuit 31, the horizontal shift register 32h, the vertical shift register 32v, the SBW selecting circuit 35, the output buffer Bff, etc. in the semiconductor substrate (based on the CMOS process) constituting the image photo array 21. Accordingly, as compared with a case where these elements are constructed separately from the semiconductor substrate in which the image photo array 21 is formed, the imager 20 can be miniaturized.

Next, another embodiment will be described with reference to FIGS. 3 and 4A-4B.

An image 20' according to this embodiment is designed so that an SBW image signal output portion 24 is provided to each of the sub windows W11 to WNM in addition to the basic construction described with reference to FIG. 1. Therefore, substantially the same constituent elements as the imager 20 described with reference to FIG. 2 are represented by the same reference numerals in FIG. 3, and the description thereof is omitted.

Figure 3:
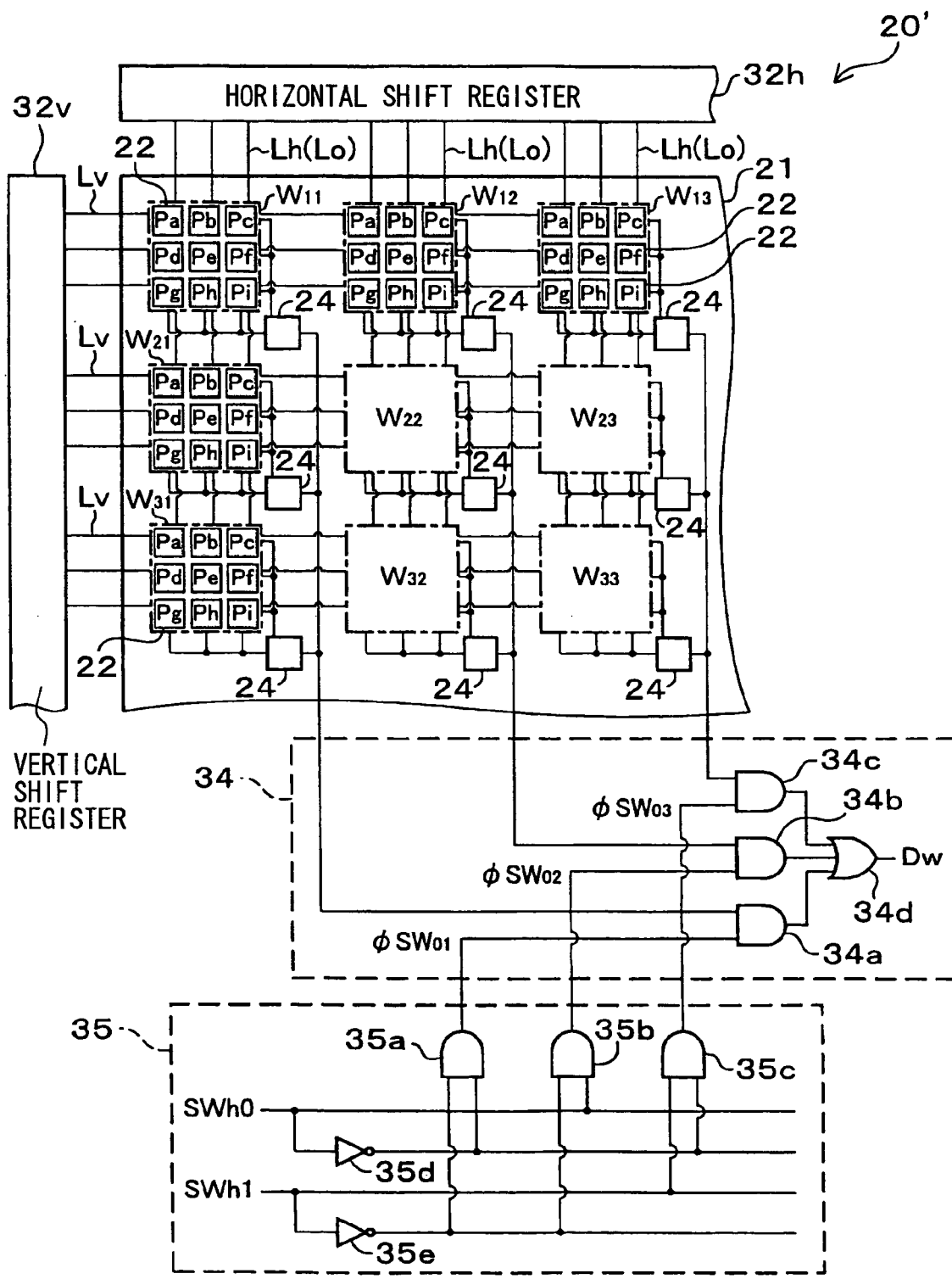
FIG. 3 is a circuit diagram showing another construction of the sub window circuit added to the basic construction shown in FIG. 1.

As shown in FIG. 3, in the imager 20' according to this example, an SBW image signal output portion 24 that can accumulate charges output from plural unit pixels 22 arranged in each sub window (W11 to WMN) is equipped to each sub window (W11 to WMN). For example, in the construction shown in FIG. 3, charges are output from respective nine (3 lines×3 columns) unit pixels 22 (Pa, Pb, Pc, Pd, Pe, Pf, Pg, Ph, Pi) constituting the sub window W11 and accumulated in the corresponding SBW image signal output portion 24. Accordingly, in the SBW image signal output portion 24, the charges output from the unit pixels 22 are combined with one another to achieve a composite charge, and a digitalized image signal corresponding to the composite charge thus achieved is output to the SBW signal output circuit 34. In this embodiment, the digital signal output from the SBW image signal output portion 24 is referred to as an image signal dw.

In the embodiment shown in FIG. 3, the SBW image signal output portion 24 is provided for every sub window (W11 to WMN). However, a common construction in which one SBW image signal output portion 24 is commonly used for two or more adjacent sub windows W11, W12, W13 may be adopted. In this case, the number of required SBW image signal output portions 24 can be reduced.

The SBW signal output circuit 34 is a multiplexer circuit for outputting the image signals dw output from the SBW image signal output portions 24 of the respective sub windows W11 to WNM according to the control signals φSW01, φSW02, φW03 output from the SBW selecting circuit 35. FIG. 3 shows the construction of the SBW signal output circuit 34 for carrying out the output control in the horizontal direction.

The SBW signal output circuit 34 shown in FIG. 3 can carry out the selection in the horizontal direction of the SBW image signal output portions 24 of the nine sub windows W11 to W33 arranged on 3 lines×3 columns. Therefore, the output terminals of the SBW image signal output portions 24 of the respective sub windows arranged in the vertical direction are commonly connected to each of one input terminals of AND circuits constituting the SBW signal output circuit 34, and also the SBW selecting circuit 35 is connected to the SBW signal output circuit 34 so that the control signals output from the SBW selecting circuit 35 can be input to the other input terminals of the AND circuits 34a to 34c.

Accordingly, for example, the outputs (image signals dw) of the SBW image signal output portions 24 corresponding to the sub windows W11, W21, W31 are input to one input terminal of the AND circuit 34a, and the control signal φSW01 output from the SBW selecting circuit 35 is input to the other input terminal of the AND circuit 34a. Likewise, the outputs (image signals dw) of the SBW image signal output portions 24 corresponding to the sub windows W12, W22, W32 are input to one input terminal of the AND circuit 34b, and the control signal φSW02 output from the SBW selecting circuit 35 is input to the other input terminal of the AND circuit 34b. Furthermore, the outputs (image signals dw) of the SBW image signal output portions 24 corresponding to the sub windows W13, W23, W33 are input to one input terminal of the AND circuit 34c, and the control signal φSW03 output from the SBW selecting circuit 35 is input to the other input terminal of the AND circuit 34c. The outputs of the respective AND circuits 34a, 34b, 34c are input to an OR circuit 34d to thereby achieve the logical add of these outputs as an output of the OR circuit 34d. That is, the sub window signal Dw is achieved as the multiplexer output.

In FIG. 3, the SBW signal output circuit 34 and the SBW selecting circuit 35 are illustrated as elements for enabling the selection in the horizontal direction of the SBW image signal output portions 24 of the sub windows W11 to W33, and attention should be paid to the fact that the SBW signal output circuit 34 and the SBW selecting circuit 35 are likewise constructed as elements for enabling the selection in the vertical direction of the SBW image signal output portions 24 of the sub windows W11 to W33. Furthermore, the SBW signal output circuit 34 and the SBW selecting circuit 35 correspond to "output signal selecting unit."

By adopting the construction of the imager 20' shown in FIG. 3, the charges output from the plural unit pixels 22 arranged in the plural sub windows W11 to WNM are accumulated and combined as a composite charge by the plural charge accumulating elements EC (SBW pixel signal output portions 24), and the composite charge concerned is converted to an image signal Dw and then outputted by the plural AD converters ADC (SBW image signal output portions 24). Any image signal Dw is selected from the plural image signals Dw output from the plural AD converters ADC (SBW image signal output portions 24) and outputted by the SBW signal output circuit 34 and the SBW selecting circuit 35.

Accordingly, the composite charge achieved for every sub window W11 to WNM can be converted to the corresponding image signal dw, and any image signal dw can be selected and output. Neither a circuit nor processing is separately required to combine the pixel signals (charges), and thus an image having low resolution can be easily achieved. Furthermore, by adopting the common construction that the SBW image signal output portion 24 common to the two or more sub windows W11, W12, W13, . . . is provided, the composite charge achieved by commonly combining these sub windows W11, W12, W13, . . . is converted to the corresponding image signal dw, and any image signal dw thus converted can be selected and output. Accordingly, as in the case of the imager 20 described above, according to the imager 20', the signal processing circuit, etc. at the outside can be simply constructed, and it is unnecessary to combine the pixel signals (charges) at the outside, so that the signal processing speed at the outside can be increased. Furthermore, a memory device, peripheral circuits thereof, etc. required to combine pixel signals (charges )are not required, so that the whole system containing the imager 20' concerned can be miniaturized. Therefore, the system can be constructed at low cost.

With respect to the imager 20', the whole circuit of the imager 20' can be constructed in the same semiconductor chip by forming the SBW image signal output portions 24, the horizontal SBW output selecting switch arrays 26, the vertical SBW output selecting switch arrays 27, the pixel signal output circuit 31, the horizontal shift register 32h, the vertical shift register 32v, the SBW signal output circuit 34, the SBW selecting circuit 35, the output buffer Bff, etc. in the semiconductor substrate (based on CMOS process) constituting the imager photo array 21. Accordingly, as compared with the construction that the above elements are formed separately from the semiconductor substrate constituting the image photo array 21, the imager 20' concerned can be miniaturized.

Figure 5:
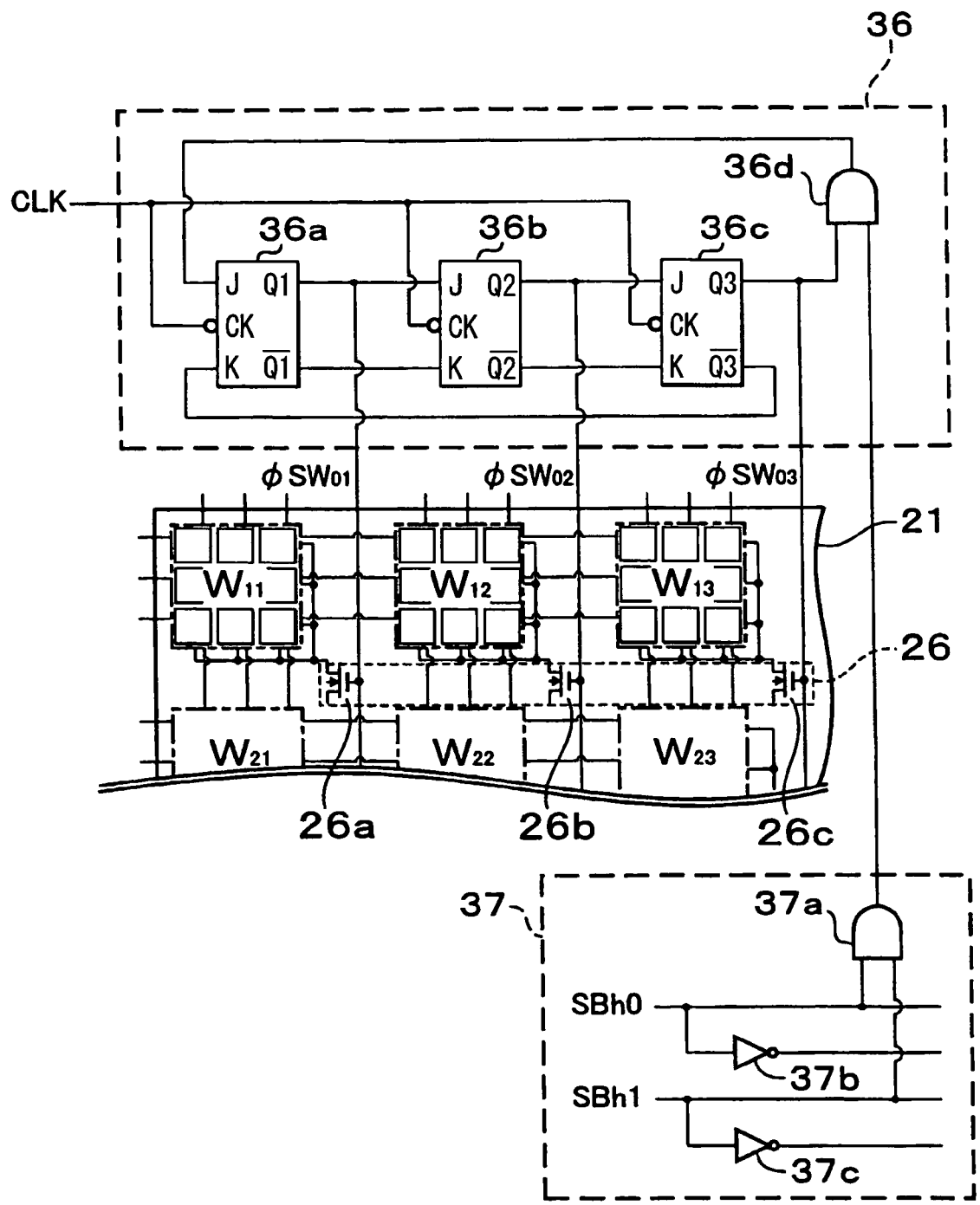
FIG. 5 is a circuit diagram showing a construction of a ring counter circuit (integrated charge selecting unit, output signal selecting unit) constituting the imager according to the embodiment.
Figure 6:
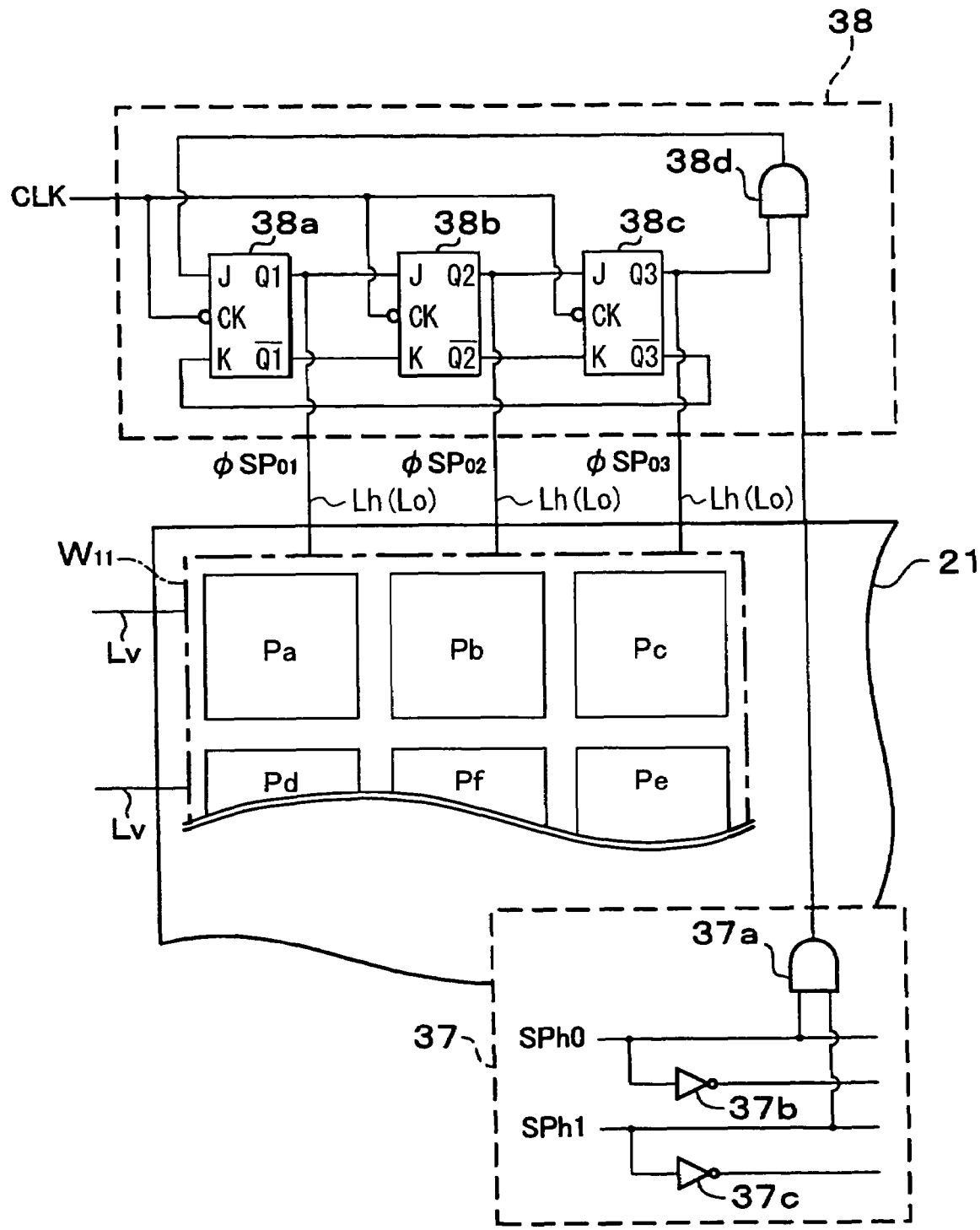
FIG. 6 is a circuit diagram showing a construction of a ring counter circuit (in-area pixel charge output control unit) constituting the imager according to the embodiment.
Figure 7:
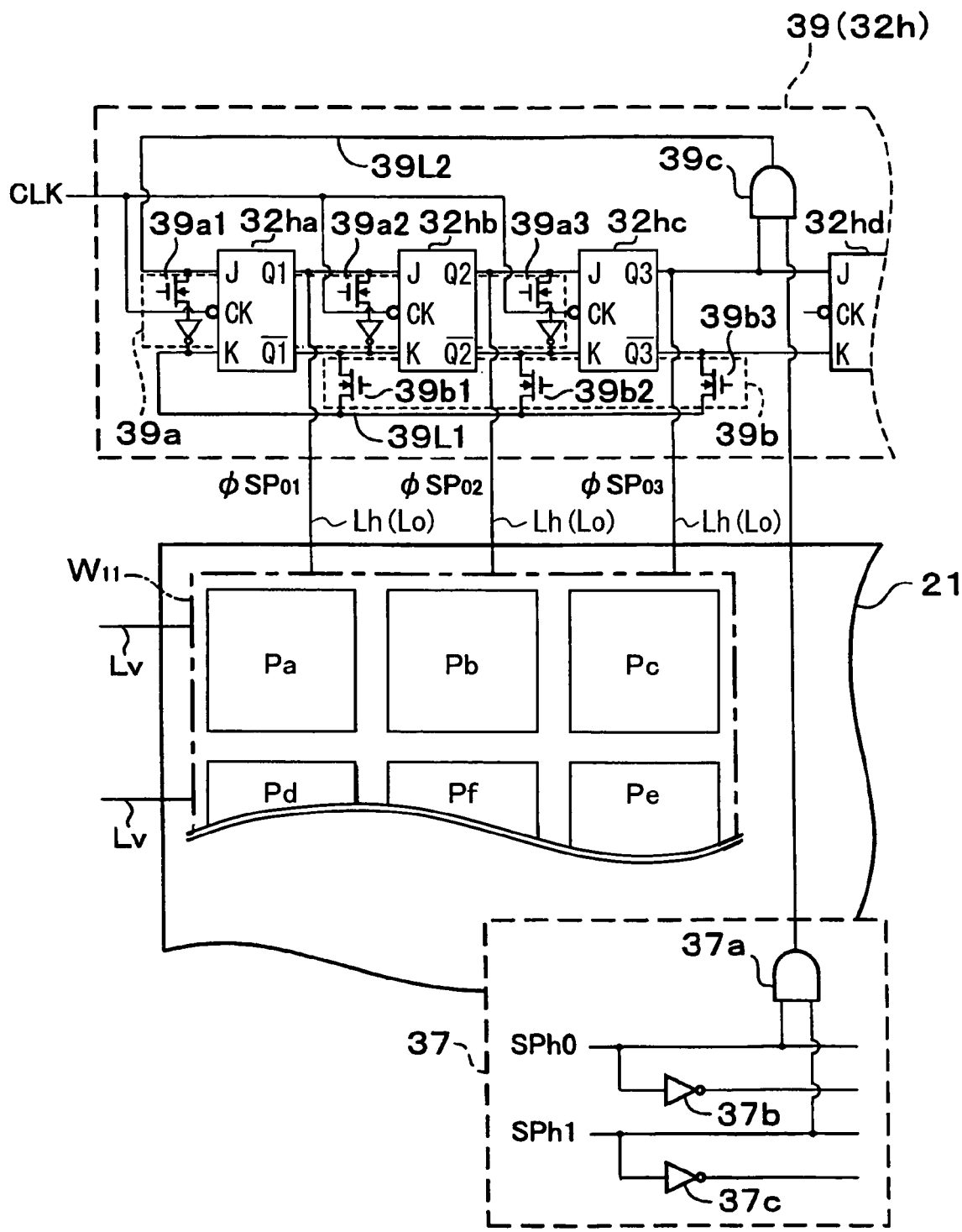
FIG. 7 is a circuit diagram showing a construction of a horizontal shift register/ring counter circuit constituting the imager according to the embodiment.

Next, modifications 1 to 3 of the imager 20 and the imager 20' according to the above-described embodiments will be described with reference to FIGS. 5 to 7. In these modifications, by adding a ring counter circuit to the construction of the imager 20, 20' described with reference to FIGS. 1 to 3, the sub window signal Dw, etc. can be repetitively output in a predetermined range. In FIGS. 5 to 7, the ring counter circuit and the peripheral circuits thereof are mainly shown, and the construction of the imager 20, 20' is omitted from the illustration. Furthermore, substantially the same constituent elements as the imager 20 described with reference to FIG. 2 and the imager 20' described with reference to FIG. 3 are represented by the same reference numerals as FIGS. 5 to 7, and the description thereof is omitted.

<Modification 1>

In a modification 1, as shown in FIG. 5, the function of repetitively selecting, in a predetermined order, plural image signals dw comprising plural integrated charges and outputted from plural coupling circuits 23, and outputting the thus-selected image signals dw to the charge accumulating elements EC is constructed and added by a ring counter circuit 36.

That is, in the modification 1, the ring counter circuit 36 is provided in place of the SBW selecting circuit 35 shown in FIG. 2. The ring counter circuit 36 is a counter achieved by connecting shift registers in a ring shape. In the modification shown in FIG. 5, three JK flip flops 36a, 36b, 36c are constructed so that they can circulatingly output the control signals φSW01, φSW02, φSW03 to the sub windows W11, W12, W13 arranged on three columns. The ring counter circuit 36 corresponds to "integrated charge selecting unit." Specifically, three JK flip flops 36a, 36b, 36c are connected so that the outputs Q1, –Q1 of the JK flip flop 36a at the preceding stage ("–Q" means a negative logic value of Q) can be continuously input to the input terminals J, K of the JK flip flop 36b at the middle stage, the outputs Q2, –Q2 of the JK flip flop 36b can be continuously input to the JK flip flop 36c at the subsequent stage, and the outputs Q3, –Q3 of the JK flip flop 36c can be continuously input to the input terminals J, K of the JK flip flop 36a at the preceding stage. Furthermore, the same clock signal CKL is input to the clock input CK of each JK flip flop 36a 36b, 36c.

Accordingly, in synchronism with the clock signal CLK input to the ring counter circuit 36, the operation of successively shifting the output pulse at each stage to the output of the neighboring stage like "Q1=1, Q2=0, Q3=0"→""Q1=0, Q2=1, Q3=0"→"Q1=0, Q2=0, Q3=1"→"Q1=1, Q2=0, Q3=0"→, . . . can be repeated. That is, the values of the control signals φSW01, φSW02, φSW03 output to the sub windows W11, W12, W13 are allowed to be circulated like "100"→"010"→"001"→"100"→"010"→, . . . , whereby the ON/OFF control of the MOS switches 26a, 26b, 26c of the horizontal SBW output selecting switch arrays 26 can be performed. Therefore, the sub windows W11 to WNM can be repetitively scanned in the horizontal direction every width of the three columns ("W11, W12, W13", "W21, W22, W23", "W31, W32, W33", . . . ).

FIG. 5 shows the construction of controlling the horizontal SBW output selecting switch array 26, and a ring counter circuit for controlling the vertical SBW output selecting switch array 27 can be constructed as in the case of the ring counter circuit 36. For example, by carrying out the ON/OFF control of the MOS switches 27a 27b, 27c, the sub windows W11 to WNM can be repetitively scanned in the vertical direction every width of three lines ("W11, W21,W23", "W12, W22, W32", "W13, W23, W33", . . . ). Accordingly, in the sub windows W11, W12, W13, etc., the sub widow signal Dw which is repetitively output can be achieved although the resolution thereof is low.

In the construction shown in FIG. 5, by interposing an AND circuit 36d in the annular connection of the ring counter circuit 36 (the wire for connecting the output Q3 of the JK flip flop 36c to the input J of the JK flip flop 36a), the circulation output of the control signals φSW01, φSW02, φSW03 by the ring counter circuit 36 is not allowed unless an H signal is input to the AND circuit 36d. That is, only when "SBh0=1, SBh1=1" is input as a ring counter starting signal, a selecting circuit 37 that can output an H level signal to the AND circuit 36d concerned is constructed by an AND circuit 37a and INV circuits 37b, 37c to enable the operation control of the ring counter circuit 36.

In FIG. 5, the function of repetitively selecting the plural image signals dw output from the plural integrated charges output from the plural coupling circuits 23 in a predetermined order and outputting the plural image signals dw to the charge accumulating element EC is implemented by the ring counter circuit 36. However, In this case, the ring counter circuit 36 is provided in place of the SBW selecting circuit 35 shown in FIG. 3, and inputs the control signals φSW01, φSW02, φSW03 output from the ring counter circuit 36 to the SBW signal output circuit 34. Accordingly, the values of the control signals φSW01, φSW02, φSW03 input to the SBW signal output circuit 34 can be circulated like "100"→"010"→"001"→"100"→"010"→, . . . , and thus the sub windows W11 to WNM are repetitively scanned in the horizontal direction every width of three columns ("W11, W12, W13", "W21, W22, W23", "W31, W32, W33", . . . ). The ring counter circuit 36 of this case corresponds to "output signal selecting unit."

As described above, in the modification 1, the ring counter circuit 36 repetitively selects the plural integrated charges output from the plural coupling circuits 23 in a predetermined order and outputs the selected integrated charges to the charge accumulating element EC. Accordingly, in arbitrary sub windows WIJ to WKL for outputting the plural integrated charges, the sub window signal Dw is repetitively achieved although the resolution is low. Therefore, for example, when with respect to a specific range, a target object is searched and a sub window signal Dw is achieved, it is unnecessary to provide the circuit and the control processing therefore, and a desired image signal can be easily and quickly achieved. Accordingly the signal processing at the outside can be simplified, and the processing speed can be enhanced. Furthermore, the whole system containing the imager 20, 20' can be miniaturized.

<Modification 2>

As shown in FIG. 6, in a modification 2, the function of controlling the plural unit pixels 22 arranged in any selected one or more sub windows WIJ to WKL out of the sub windows W11 to WNM so that the charges can be output in a predetermined order from the plural unit pixels 22 is constructed and added to the ring counter circuit 38.

That is, in the modification 2, a ring counter circuit 38 is provided in place of the horizontal shift register 32h shown in FIG. 1. The ring counter circuit 38 is constructed by plural JK flip flops as in the case of the ring counter circuit 36 described in the modification 1. In this case, the description of the circuit construction is omitted. The ring counter circuit 38 is constructed by three JK flip flops 38a, 38b, 38c as in the case of the JK flip flop 36a, and it is designed so that φSP01, φSP02, φSP03 are circulatingly output as control signals. The ring counter circuit 38 corresponds to "in-area pixel charge output control unit."

In the ring counter circuit 38, in synchronism with the clock signal CLK input to the ring counter circuit 38, the operation of successively shifting the output pulse at each stage to the neighboring output is repeated like "Q1=1, Q2=0, Q3=0"→"Q1=0, Q2=1, Q3=0"→"Q1=0, Q2=0, Q3=1"→"Q1=1, Q2=0, Q3=0"→, . . . , so that the control signals φSP01, φSP02, φPS03 that circulatingly vary like "100"→"010"→"001"→"100"→"010"→, . . . are output to the three unit pixels 22 (Pa, Pb, Pc) in the horizontal direction in the sub window W11, for example. Accordingly, the unit pixels 22 of Pa, Pb, Pc are successively subjected to the ON/OFF control, so that the unit pixels 22 can be repetitively scanned in the horizontal direction every width of three columns ("Pa, Pb, Pc", "Pd, Pe, Pf", "Pg, Ph, Pi"). That is, the imager signal Dp of each unit pixel 22 can be repetitively achieved in a predetermined range. The processing of outputting the imager signal Dp of each unit pixel 22 with respect to a predetermined range out of the plural unit pixels 22 in the sub window will be referred to as "sub block processing".

FIG. 6 shows the construction of controlling plural unit pixel units 22 in the horizontal direction, however, the ring counter circuit for controlling plural unit pixels 22 in the vertical direction can be also constructed similarly to the case of the ring counter circuit 38. Furthermore, not only the plural unit pixels 22 arranged in the sub window W11, but also the plural unit pixels 22 arranged in the range over the two or more sub windows W11 to WNM can be repetitively scanned in a predetermined range by the control signals φSP01, φSP02, φPS03, etc. The selecting circuit 37 shown in FIG. 6 is constructed as in the case of the selecting circuit 37 for controlling the ring counter circuit 36 described with respect to the modification 1, and it corresponds to "area selecting unit."

As described above, in the modification 2, any one or more sub windows WIJ to WKL out of the sub windows W11 to WNM are selected by the selecting circuit 37, and the plural unit pixels 22 arranged in the sub windows WIJ to WKL selected in the selecting circuit 37 are controlled by the ring counter circuit 38 so that the charges can be output from the plural unit pixels 22 concerned in a predetermined order. Accordingly, the charges are output in a predetermined order from the plural unit pixels 22 arranged in any sub window WIJ to WKL (sub block processing), so that an image signal having high resolution can be achieved in any sub window WIJ to WKL.

Therefore, when a target object is recognized by the low-resolution sub window signal Dw based on the integrated charge or image signal dw of each sub window W11 to WMN, the target object concerned can be recognized by the imager signal Dp of high resolution by setting the existence range of the target object concerned to any sub window WIJ to WKL concerned. That is, both the low-resolution sub window signal dw and the high-resolution imager signal Dp can be output without separately providing the sub block circuit and the sub block processing for achieving the imager signal Dp at the outside. Accordingly, the signal processing at the outside can be further simplified and the processing speed can be further enhanced. Furthermore, the whole system containing the imager 20, 20' can be further miniaturized.

<Modification 3>

As shown in FIG. 7, the modification 3 is equipped with a horizontal shift register/ring counter circuit 39 achieved by constructing a ring counter 38 by a part of the horizontal shift register 32h that can control plural unit pixels 22 so that charges can be output in a predetermined order irrespective of the sub windows W11 to WNM. That is, in the modification 3, a switching circuit 39a1, a sub block selecting circuit 39a2, etc. are added to some of plural JK flip flops 32ha, 32hb, 32hc, . . . (JK flip flops 32ha, 32hb, 32hc), thereby enabling the function of the ring counter circuit 38 shown in FIG. 6.

Specifically, an inverter circuit is interposed between the input terminals J, K of each JK flip flop by the function switching circuit 39a. Accordingly, when the inverter circuit concerned is interposed, the negative logic value of the logic value input to the input terminal J is input to the input terminal K, and thus the JK flip flop concerned functions as a D flip flop. It is controlled by an MOS switch connected to each inverter circuit in series whether the inverter circuit should be interposed or not.

By the sub block selecting circuit 39b, the presence or absence of the annular connection of the ring counter circuit (the wire for connecting the output terminal –Q of the JK flip flop at the subsequent stage to the input terminal K of the JK flip flop at the front stage) and the connection position thereof are controlled by plural MOS switches. Furthermore, by interposing an AND circuit at some midpoint of the wire for connecting the output terminal Q of the JK flip flop at the last stage to the input terminal J of the JK flip flop at the front stage, a circuit construction which is a similar annular connection is achieved so that it does not function as a ring counter circuit unless an H level signal is input to the AND circuit concerned. The H level signal is controlled by the selecting circuit 37 as in the case of the modifications 1, 2 described above. Furthermore, FIG. 7 shows a construction in the horizontal direction, and with respect to the vertical direction, the same construction can be adopted for the vertical shift register 32v.

When the same function as the modification 2 described above is applied to the horizontal shift register 32h, for example, as shown in FIG. 7, an inverter circuit and MOS switches 39a1, 39a2, 39a3 are connected between the input terminals J, K of each of the JK flip flops 32ha, 32hb, 32hc to constitute a function switching circuit 39a. A wire 39L1 for connecting the output terminal –Q3 of the JK flip flop at the rear stage to the input terminal K of the JK flip flop 32ha at the front stage is provided, and MOS switches 39b1, 39b2, 39b3 are interposed between the output terminals –Q1, –Q2, –Q3 of the respective JK flip flops 32ha, 32hb, 32hc and the wire 39L1. Furthermore, an AND circuit 39c whose one input terminal is connected to the output terminal of the selecting circuit 37 is interposed at some midpoints of a wire 39L2 for connecting the output terminal Q3 of the JK flip flop 32hc at the rear stage to the input terminal J of the JK flip flop 32ha at the front stage.

By adding the function switching circuit 39a, the sub block selecting circuit 39b, the AND circuit 39c, etc. to a part of the horizontal shift resister 32h as described above, for example when the H level signal is applied to each of the gate terminals of the MOS switches 39a1, 39a2, 39a3 as the switching signal, the L level signal is input to each of the gate terminals of the MOS switches 39b1, 39b2, 39b3 as the sub block selecting signal and further the L level signal is input to the AND circuit 39c by the selecting circuit 37, the horizontal shift register/ring counter circuit 39 corresponding to the horizontal shift register 32h functions as a horizontal shift register.

Furthermore, when the L level switching signal is input to each of the gate terminals of the MOS switches 39a1, 39a2, 39a3, the H level sub lock selecting signal is input to each of the gate terminal of the MOS switches 39b1, 39b2, 39b3 and the H level signal is input to the AND circuit 39c by the selecting circuit 37, the horizontal shift register/ring counter circuit 39 functions as a ring counter.

When the MOS switches 39b1, 39b2, 39b3 of the sub block selecting circuit 39b are set so that the MOS switch 39b1 is turned off, the MOS switch 39b2 is turned off and the MOS switch 39b2 is turned on by the switching signal, the nine unit pixels 22 on 3 lines×3 columns (Pa, Pb, Pc, Pd, Pe, Pf, Pg, Ph, Pi) can be subjected to the sub block processing. Furthermore, when the MOS switches 39b1, 39b2, 39b3 are set so that the MOS switch 39b1 is turned off, the MOS switch 39b2 is turned on and the MOS switch 39b2 is turned off by the switching signal, the four unit pixels 22 on 2 lines×2 columns (Pa, Pb, Pd, Pf) can be subjected to the sub block processing. In the case of the construction shown in FIG. 7, even when the MOS switches 39b1, 39b2, 39b3 are set to the ON/OFF states other than the states described above, it is not effective.

The horizontal shift register 32h and the vertical shift register 32v correspond to "pixel charge output control unit." Furthermore, the horizontal shift register/ring counter circuit 39 corresponds to "pixel charge output control unit" and "in-area pixel charge output control unit."

As described above, according to the modification 3, the horizontal shift register/ring counter circuit 39 constitutes a part or the whole of the horizontal shift register 32h and the vertical shift register 32v. Accordingly, the horizontal shift register/ring counter circuit 39 can be constructed by using some or all of the circuit elements constituting the horizontal shift register 32h and the vertical shift register 32v which are normally equipped, and thus the circuit scale can be reduced to be smaller as compared with the case where the above elements are not used. Accordingly, the whole system containing the imager 20, 20' can be further miniaturized.

Figure 8:
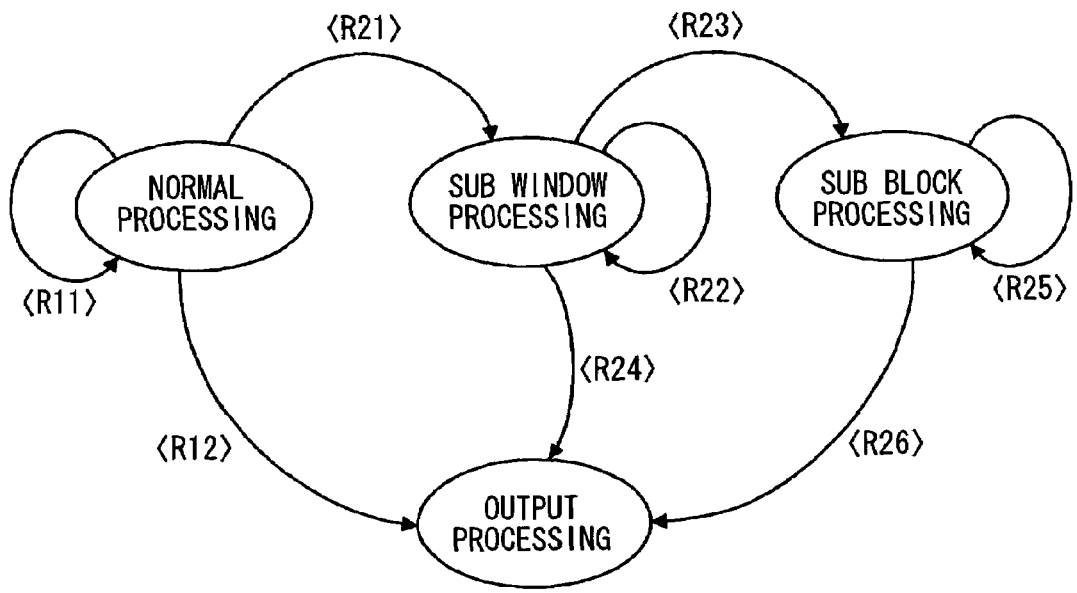
FIG. 8 is a state transition diagram showing the shift order of image signal output control processing of the imager according to the embodiment.

Next, an example of the image signal output control processing by the imager 20, 20' (hereinafter referred to as "imager 20 or the like") will be described with reference to FIGS. 8 to 11. This processing is carried out by a microcomputer (Digital Signal Processor may be also used) (not shown) connected to the imager 20 or the like, and the microcomputer concerned corresponds to "the outside". As not shown, a predetermined program stored in a semiconductor memory device or the like constituting the microcomputer concerned is executed by CPU constituting the microcomputer concerned, whereby the image signal output control processing is carried out. FIG. 8 is a state transition diagram based on the image signal output control processing, and the transition of the processing state will be also described when the flowchart of FIG. 9 is described.

As shown in FIG. 8, in the imager 20, etc., when the resolution of the image signal to be output is given priority over the processing speed, the normal processing is continued until a target object is recognized by the basic construction shown in FIG. 1 (R11), and when the target object concerned is recognized, the imager signal Dp of each unit pixel 22 is output from the pixel signal output circuit 31 (R12). On the other hand, when the processing speed for outputting the image signal is given priority over the resolution, the processing shifts to the sub block processing (R21). It should be considered that the step of the normal processing is omitted from the flowchart of FIG. 9 and the processing thereof is started from the stage where the processing shifts to the sub block processing. Before shifting the sub window processing, a parameter for determining a required sub window size is delivered from a main routine (not shown) to the sub window processing.

Figure 10:
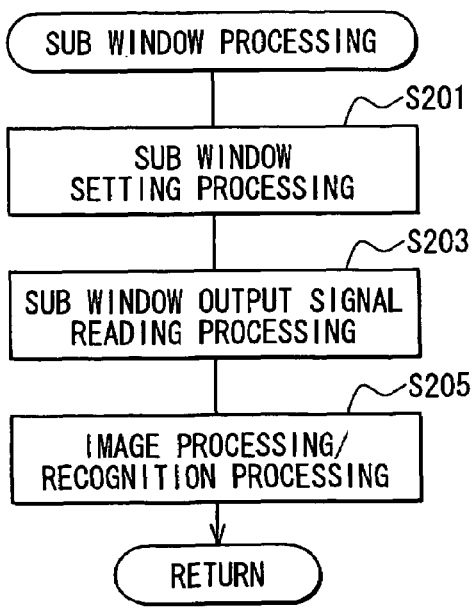
FIG. 10 is a flowchart showing the flow of the sub window processing based on the image signal output control processing of the imager according to the embodiment.
Figure 9:
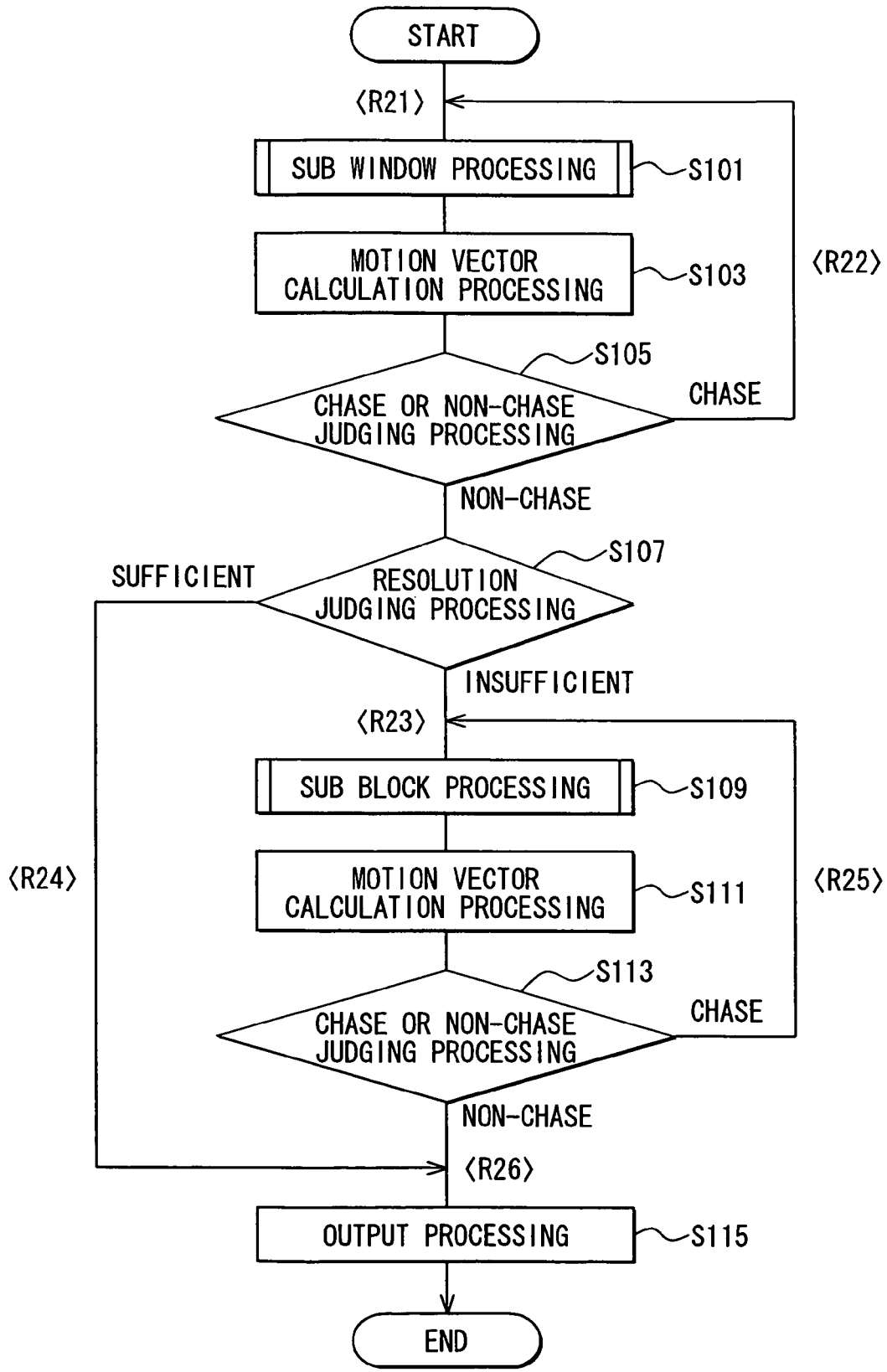
FIG. 9 is a flowchart showing the flow of the image signal output control processing of the imager according to the embodiment.

As shown in FIG. 9, when the sub window processing is called in step 101, sub window setting processing is executed in step S201 shown in FIG. 10. This processing sets the size or the like of the sub window delivered as a parameter to hardware shown in FIG. 2 or 3. In FIG. 2 or 3, the sub window size is set to 3 lines×3 columns.

In subsequent step S203, sub window output signal processing is executed. The sub window signal Dw output from the SBW image signal output portion 24 shown in FIG. 2 or the SBW signal output circuit 34 shown in FIG. 3 is input to the microcomputer concerned, and thus the processing of reading the sub window signal Dw is based on this step.

In step S205, predetermined image processing is executed or recognition processing is executed on the basis of the sub window signal Dw read in step S203. When the image processing/recognition processing based on step S205 is finished, this sub window processing is finished, and the processing shifts to the processing of step S103 shown in FIG. 9.

In step S103 of FIG. 9, motion vector calculation processing is executed. This processing detects a motion vector, and on the basis of this result, a judgment as to whether there is any target object to be chased, that is, tracking execution or non-execution judging processing is executed in the next step S105.

When a target object to be chased is confirmed in step S105 (S105: execution), the processing shifts to step S101 to execute the sub window processing again. That is, the processing shifts to the processing of giving the processing speed priority over the resolution. In this case, a state where the sub window processing shown in FIG. 8 is repeated is set (R22).

When no target object to be chased is conformed in step S105 (S105: non-execution), the processing shifts to the subsequent step S107 to execute the processing of judging whether the resolution is sufficient or not, that is, resolution judging processing.

When it is judged in step S107 that the resolution is sufficient (S107: sufficient), the processing shifts to step S115 to execute the processing of outputting the sub window signal Dw which has been read before now. In this case, the state transits to the output processing as shown in FIG. 8 (R26).

On the other hand, when it is judged in step S107 that the resolution is not sufficient (S107: insufficient), a necessary sub block is determined and set to the parameter, and then the processing shifts to the sub block processing based on step S109. In this case, the state transits to the sub block processing as shown in FIG. 8 (R23).

Figure 11:
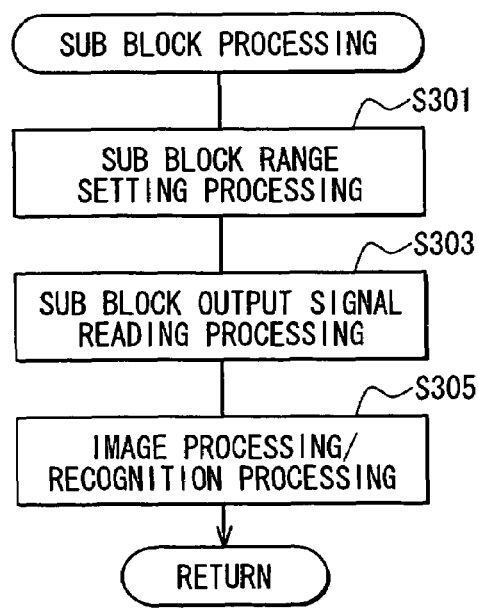
FIG. 11 is a flowchart showing the flow of the sub block processing based on the image signal output control processing of the imager according to the embodiment.

When the sub block processing is called in step S109, the sub block range setting processing is executed in step S301 shown in FIG. 11. This processing is to set the size or the like of the sub block delivered as a parameter in step S107 to the hardware shown in FIGS. 2 and 3. In FIGS. 6 and 7, the sub block size is set to 3 lines×3 column.

In subsequent step S303, sub block output signal reading processing is executed. The imager signal Dp in the sub block range which is output from the pixel signal output circuit 31 shown in FIG. 1 is input to the microcomputer concerned, and thus this step reads this signal.

In step S305, predetermined image processing is executed or recognition processing is executed on the basis of the imager signal Dp read in step S303. When the image processing/recognition processing based on step S305 is finished, this sub block processing is finished, and thus the processing shifts to step S111 shown in FIG. 9.

In step S111 shown in FIG. 9, the motion vector calculation processing is executed. This processing detects a motion vector as in the case of step S103 described above, and on the basis of this result, a judgment as to whether there is any target object to be chased, that is, chasing execution or non-execution judging processing is conducted in the next step S113.

When a target object to be chased in step S113 is confirmed (S113: execution), the processing shifts to step S109 to execute the sub block processing again. In this case, the state of repeating the sub block processing is set as shown in FIG. 8 (R25).

On the other hand, when no target object to be chased in step S111 is confirmed (S113: non-execution), the processing shifts to the subsequent step S115 to execute the processing of outputting the imager Dp in the sub block range which has been read before now. In this case, the state transits to the output processing as shown in FIG. 8. Then, the series of image signal output control processing is finished.

Figure 12A:
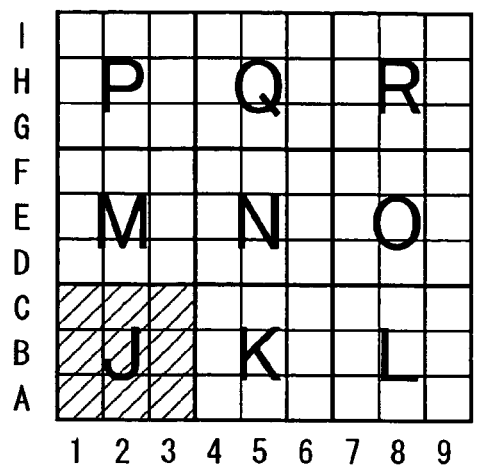
FIG. 12A is a pattern diagram when sub windows are arranged on 3 lines×3 columns in an imager photo array of 9 lines×9 column.
Figure 12B:
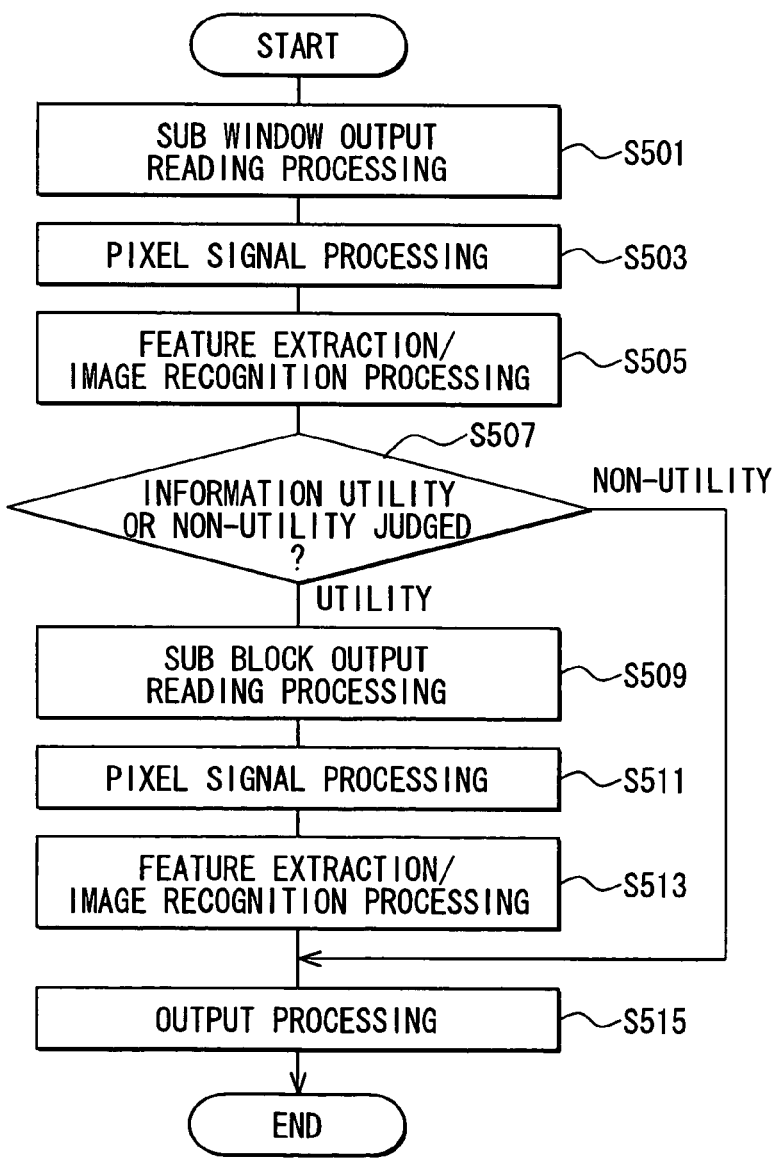
FIG. 12B is a flowchart showing the summary of the control processing when sub window processing and sub block processing are executed.

By executing the image signal output control processing described above, the load of the image processing by the microcomputer can be reduced. For example, when the imager photo array 21 comprising 9 lines x 9 columns is divided into sub windows of 3 lines×3 columns as shown in FIG. 12A, a load to be imposed when the sub window of "J" is processed will be considered on the basis of the flowchart shown in FIG. 12B.

First, in the sub window output reading processing of step S501, the sub window signals Dw output from the nine sub windows of 3 line×3 columns are read (signal number: 9). In the pixel signal processing of step S503, the nine sub window signals Dw read out in step S501 are processed (signal processing number: nine). In the feature extraction/image recognition processing based on step S505, the nine sub window signals Dw are likewise processed (target signal number: nine). When "non-utility" is judged in information utility or non-utility judging processing of step S507 (S507: non-utility), the output processing is executed in step S515. That is, in this case, the processing is the shortest processing, and the total signal processing number is equal to 9(S501)+9(S503)+9(S505)=27.

When "utility" is judged in the information utility or non-utility judging processing of step S507 (S507: utility), the sub block output reading processing is executed in the subsequent step S509. The sub block is set to 3 lines ×3 columns, and thus the imager signals Dp output from nine unit pixels are read out (signal number: 9). In the pixel signal processing of step S511, the nine imager signals Dp read out in step S509 are processed (signal processing number: 9). In the feature extraction/image recognition processing of step S513, the nine imager signals Dp are likewise processed (target signal number: nine). Then, the output processing is executed in step S515. That is, in this case, the processing is the longest processing, and the total signal processing number is equal to 9(S501)+9(S503)+9(S505)+9(S509)+9(S511)+9(S513)=54.

Figure 13A:
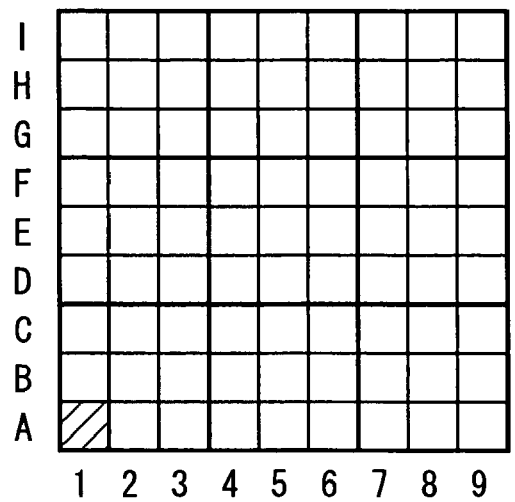
FIG. 13A is a pattern diagram when no sub window is set in the imager photo array of 9 lines×9 columns.
Figure 13B:
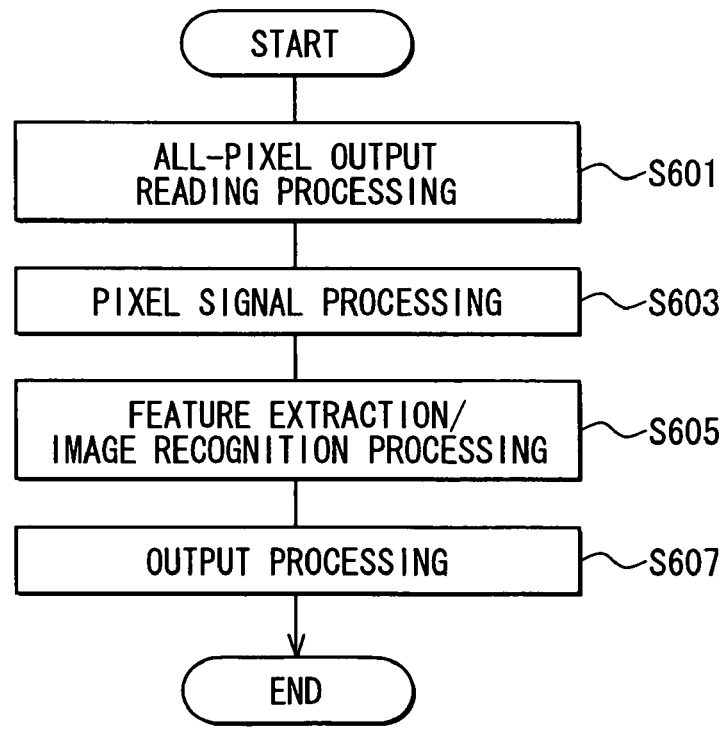
FIG. 13B is a flowchart showing the summary of the control processing when neither the sub window processing nor the sub block processing is conducted.

On the other hand, the load to be imposed when the imager signals Dp of eighty one unit pixels are directly processed without dividing the imager photo array 21 of 9 lines×9 columns to sub windows will be considered on the basis of the flowchart shown in FIG. 13B.

First, in the all-pixel output reading processing of step S601, the imager signals Dp output from eighty one unit pixels of 9 lines×9 columns are read out (signal number: 81). In the pixel signal processing based on step S603, the eighty one imager signals Dp read out in step S601 are processed (signal processing number: 81). In the feature extraction/image recognition processing of step S605, the eighty one imager signals Dp are likewise processed (target signal number: 81). Then, the output processing is executed in step S515. The total signal processing number is equal to 81(S601)+81(S603)+81(S605)=243.

In the case of the imager photo array of 9 lines×9 columns as described above, when the sub window processing and the sub block processing are executed, the signal processing number is equal to 27 at minimum and 54 at maximum. On the other hand, when these processing is not executed, the signal processing number is equal to 243. Accordingly, the load of the image processing to be imposed on the microcomputer can be greatly reduced (in the above case, about 80% can be reduced) by executing the image signal output control processing described above.

Furthermore, according to this embodiment, one sub window W11 to WNM is constructed by arranging nine unit pixels 22 (Pa, Pb, Pc, Pd, Pe, Pf, Pg, Ph, Pi) in the matrix form of 3 lines×3 columns, however, the present invention is not limited to this embodiment. For example, each sub window W11 to WNM may be constructed by arranging the unit pixels in a square matrix like 6 lines×6 columns, 9 lines×9 columns, 12 lines×12 columns or the like, or in a non-square matrix like 6 lines×9 columns or 6 lines×12 columns.

Still furthermore, in the above-described embodiment, each logic circuit is constructed by positive logic, however, the same action and effect as described above can be achieved by inverting the polarities of the MOS transistors and the MOS switches to construct each logic circuit by negative logic.

What is claimed is:

1. An image scanning device in which an image scanning element group constructed by arranging CMOS type image scanning elements in a matrix form is divided into a plurality of areas and an image signal is output for every area, comprising:

a plurality of charge integrating units, each of the charge integrating units being provided in each of the plurality of areas for integrating charges output from plural image scanning elements arranged in the area concerned and outputting the charges thus integrated as an integrated charge;

an integrated charge selecting unit for selecting any one or more integrated charges from the plural integrated charges output from the plural charge integrating units and outputting the integrated charges thus selected;

a charge accumulating unit for accumulating and combining any one or more integrated charges output from the integrated charge selecting unit as a composite charge;

an image signal outputting unit for converting the composite charge accumulated in the charge accumulating unit to an image signal and outputting the image signal thus converted;

an area selecting unit for selecting one or more arbitrary areas out of the plural areas, and an in-area pixel charge output control unit for controlling plural image scanning elements arranged in the one or more areas selected by the area selecting unit so that charges can be output in a predetermined order from the plural image scanning elements;

a pixel charge output control unit for controlling the plural image scanning elements so that charges can be output in a predetermined order irrespective of the plural areas, wherein the in-area pixel charge output control unit constitutes a part or the whole of the pixel charge output control unit; and a microcomputer, wherein the integrated charge selecting unit repetitively selects the plural integrated charges output from the plurality of charge integrating units in a predetermined order and outputting the integrated charges to the charge accumulating unit, wherein the microcomputer is configured to execute a sub window process so that the image signal outputting unit outputs the image signal as a low resolution image, and wherein the microcomputer is configured to execute a sub block process so that the in-area pixel charge output unit controls the plural image scanning elements in the one or more areas selected by the area selecting unit to output the charges as a high resolution image when the microcomputer determines that resolution of the low resolution image is not sufficient.

2. The image scanning device according to claim 1, wherein at least one of the charge integrating unit, the integrated charge selecting unit, the charge accumulating unit and the image signal output unit is formed in a semiconductor substrate in which the image scanning element group is formed.

3. An image scanning device in which an image scanning element group constructed by arranging CMOS type image scanning elements in a matrix form is divided into plural areas and an image signal is output every area, comprising:

plural charge accumulating units each of which is provided to each of the plural areas or commonly provided to two or more of the plural areas and can accumulate and combine charges output from plural image scanning elements arranged in the area concerned as a composite charge;

plural image signal output units each of which is provided every charge accumulating unit, converts the composite charge accumulated in the charge accumulating unit to an image signal and then outputs the image signal thus converted;

an output signal selecting unit for selecting any image signal from plural image signals output from the plural image signal output units and outputting the image signal thus selected;

an area selecting unit for selecting one or more arbitrary areas out of the plural areas, and an in-area pixel charge output control unit for controlling the plural image scanning elements so that charges are output control unit for controlling the plural image scanning elements arranged in the one or more areas selected by the area selecting unit;

a pixel control unit for controlling the plural image scanning elements so that the charges can be output in a predetermined order irrespective of the plural areas, wherein the in-area pixel output control unit constitutes a part or the whole of the pixel charge output control unit; and a microcomputer, wherein the output signal selecting unit repetitively selects and outputs plural image signals output from the plural image signal output units in a predetermined order, wherein the microcomputer is configured to execute a sub window process so that each of the plural image signal outputting units outputs the image signal as a low resolution image, and the microcomputer is configured to execute a sub block process so that the in-area pixel charge output unit controls the plural image scanning elements in the one or more areas selected by the area selecting unit to output the charges as a high resolution image when the microcomputer determines that resolution of the low resolution image is not sufficient.

4. The image scanning device according to claim 3, wherein at least one of the charge accumulating unit, the image signal output unit and the output signal selecting unit is formed in a semiconductor substrate in which the image scanning element group is formed.

* * * * *